(12) United States Patent
Yoon et al.

(10) Patent No.: US 7,795,085 B2
(45) Date of Patent: Sep. 14, 2010

(54) INTENTIONAL POCKET SHADOWING TO COMPENSATE FOR THE EFFECTS OF CROSS-DIFFUSION IN SRAMS

(75) Inventors: Jong Shik Yoon, San Diego, CA (US); Amitava Chatterjee, Plano, TX (US); Kayvan Sadra, Addison, TX (US); Shaoping Tang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 326 days.

(21) Appl. No.: 11/451,264

(22) Filed: Jun. 12, 2006

(65) Prior Publication Data
US 2007/0287239 A1    Dec. 13, 2007

(51) Int. Cl.
*H01L 21/8238* (2006.01)

(52) U.S. Cl. ............... 438/199; 438/527; 257/E21.346; 257/E21.633

(58) Field of Classification Search ............... 438/184, 438/199, 527, 231, 232, 302; 257/E27.099, 257/E21.12, E21.346, E21.633
See application file for complete search history.

(56) References Cited

U.S. PATENT DOCUMENTS

| | | | |
|---|---|---|---|
| 5,827,763 A | * | 10/1998 | Gardner et al. ............. 438/232 |
| 6,797,592 B2 | * | 9/2004 | Brown et al. ................ 438/510 |
| 7,132,340 B2 | * | 11/2006 | Sadra et al. ................. 438/302 |
| 7,205,616 B2 | * | 4/2007 | Momiyama ................. 257/369 |

* cited by examiner

*Primary Examiner*—Khiem D Nguyen
(74) *Attorney, Agent, or Firm*—Warren L. Franz; Wade J. Brady, III; Frederick J. Telecky, Jr.

(57) ABSTRACT

Methods are disclosed for forming an SRAM cell having symmetrically implanted active regions and reduced cross-diffusion therein. One method comprises patterning a resist layer overlying a semiconductor substrate to form resist structures about symmetrically located on opposite sides of active regions of the cell, implanting one or more dopant species using a first implant using the resist structures as an implant mask, rotating the semiconductor substrate relative to the first implant by about 180 degrees, and implanting one or more dopant species into the semiconductor substrate with a second implant using the resist structures as an implant mask. A method of performing a symmetric angle implant is also disclosed to provide reduced cross-diffusion within the cell, comprising patterning equally spaced resist structures on opposite sides of the active regions of the cell to equally shadow laterally opposed first and second angled implants.

4 Claims, 22 Drawing Sheets

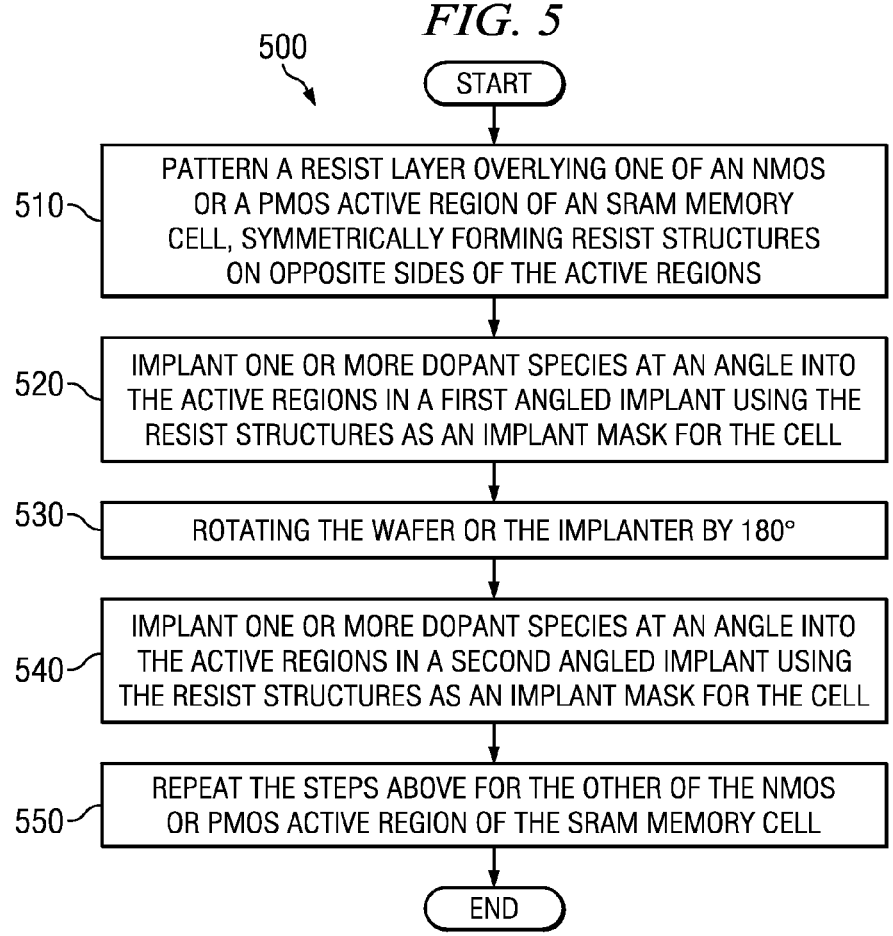

INTENTIONAL POCKET SHADOWING TO COMPENSATE FOR THE EFFECTS OF CROSS-DIFFUSION IN SRAMS

FIELD OF INVENTION

The present invention relates generally to semiconductor processing, and more particularly to a method of forming an SRAM cell having symmetrically implanted active regions and reduced cross-diffusion by utilizing increased pocket shadowing during angled implantations to facilitate improved device matching characteristics, particularly in static random access memory (SRAM).

BACKGROUND OF THE INVENTION

Several trends presently exist in the semiconductor and electronics industry. Devices are continually being made smaller, faster and requiring less power. One reason for these trends is that more personal devices are being fabricated that are relatively small and portable, thereby relying on a battery as their primary supply. For example, cellular phones, personal computing devices, and personal sound systems are devices that are in great demand in the consumer market. In addition to being smaller and more portable, personal devices are also requiring increased memory and more computational power and speed. In light of all these trends, there is an ever increasing demand in the industry for smaller and faster transistors used to provide the core functionality of the integrated circuits used in these devices.

Accordingly, in the semiconductor industry there is a continuing trend toward manufacturing integrated circuits (ICs) with higher densities. To achieve high densities, there has been and continues to be efforts toward scaling down dimensions (e.g., at submicron levels) on semiconductor wafers, that are generally produced from bulk silicon. In order to accomplish such high densities, smaller feature sizes, smaller separations between features, and more precise feature shapes are required in integrated circuits fabricated on small rectangular portions of the wafer, commonly known as dies. This may include the width and spacing of interconnecting lines, spacing and diameter of contact holes, as well as the surface geometry of various other features (e.g., corners and edges). The scaling-down of integrated circuit dimensions can facilitate faster circuit performance and/or switching speeds, and can lead to higher effective yield in IC fabrication by providing more circuits on a die and/or more die per semiconductor wafer.

The process of manufacturing integrated circuits typically consists of many steps, during which hundreds or thousands of copies of an integrated circuit can be formed on a single wafer. This process can create electrically active regions in and on the semiconductor wafer surface. In MOS transistors, for example, a gate structure containing conductive material(s) is created, that can be energized to establish an electric field within a semiconductor channel, by which current is enabled to flow through the channel defined under the gate structure and between a source and drain region within the transistor. The source and drain regions and/or an upper portion of the gate structure facilitate this conductance by virtue of containing a majority of positively charged (p) or negatively charged (n) dopant materials. Adjusting the voltage applied to the gate changes the amount of current flowing through the channel. A gate electrode of the gate structure is separated from the channel by a gate dielectric, which is an insulator and which opposes current flow between the gate electrode and channel, such that the device does not conduct current until a sufficient voltage (at least as large as a threshold voltage $V_t$) is applied to the gate electrode.

Dopant atoms are implanted into the source and drain (S/D) regions to establish the n or p type regions. During source/drain implantation, however, cross-diffusion may occur within a polysilicon (poly) gate region overlying these n and p type doped regions, which undesirably raises the threshold voltage $V_t$ and lowers $I_{Drive}$ of transistors, which share the common polysilicon gate region.

One type of implant is the "pocket implant" or "halo implant" that includes implanting a dopant species at an angle (relative to a substantially non-angled or normal angle perpendicular to the surface, including a relatively small angle off the zero angle or normal angle) extending under a portion of the gate region of a transistor. The pocket implant may be used to control the $V_t$ and improve the performance of a transistor by providing a means to scale the channel length and increase the transistor drive current without causing an increase in the off-state leakage current. These angled implants are typically applied to the semiconductor wafer at multiple (e.g., four) different rotational positions, "twists", "quads", or quadrants of the wafer (e.g., at 0°, 90°, 180°, 270°, or 45°, 135°, 225°, 315°), in an attempt to provide a relatively uniform dosage of the wafer. Additional implantations, however, generally produce a greater $V_t$.

In semiconductor processing, a patterned resist layer is used to mask or guide the implantation of the dopant atoms to the underlying layers to establish source, drain, and other such active regions or areas of the semiconductor device. Resist is typically used to cover pMOS regions when nMOS areas are implanted and covers nMOS regions when pMOS areas are implanted.

Because the pocket implant is tilted at an angle, a nearby device or resist layer edge may shadow part of the exposed transistor area, preventing some dopant atoms from entering the substrate with their original energy or from reaching the substrate at all. This phenomenon is referred to as "pocket shadowing" or "pocket blocking". Such a reduced dosage of the intended pocket species in the transistor generally results in undesirable deviations of the electrical characteristics of the transistor, such as a lower threshold voltage $V_t$ and a raised $I_{Drive}$ than that originally designed for the transistor. Thus, such shadowing has traditionally been avoided to mitigate these undesirable deviations of the transistor characteristics as well as the imbalances these transistors may produce in a circuit (e.g., transistors of a memory cell).

In addition, despite attempts to avoid pocket shadowing, as semiconductor features are aggressively reduced, pocket shadowing issues may increase, and associated disadvantageous effects resulting therefrom may become more prevalent as transistor widths and lengths are reduced. In general, the problems of pocket shadowing refer to dosage imbalances or the differences in the amount of dopant atoms received within certain areas (e.g., source/drain regions) as those areas are reduced in size. For example, shadowing tends to reduce the Vt of a transistor to less than its desired value. In addition, in situations where there is resist misalignment, a right transistor Vt, for example, may be altered more or less than a left transistor Vt, thereby disadvantageously creating transistor mismatch or other such imbalances. It can be appreciated that the effects of pocket shadowing may be even more noticeable in certain types of semiconductor devices, such as static random access memory (SRAM), for example, which incorporate multiple densely packed transistors that require matched electrical properties.

Semiconductor memories can, for example, be characterized as volatile random access memories (RAMs) or nonvolatile read only memories (ROMs), where RAMs can either be static (SRAM) or dynamic (DRAM) differing mainly in the manner by which they store a state of a bit. In SRAM, for example, each memory cell includes transistor-based circuitry that implements a bistable latch, which relies on transistor gain and positive (e.g., reinforcing) feedback so that it can only assume one of two possible states, namely on (state 1) or off (state 2).

The latch can only be programmed or induced to change from one state to the other through the application of a voltage or other external stimuli. This arrangement is desirable for a memory cell since a state written to the cell will be retained until the cell is reprogrammed. DRAMs on the other hand implement a capacitor that is either charged or discharged to store the on (state 1) or off (state 2) state of a cell. Capacitors discharge over time, however, and DRAMs must therefore be periodically 'refreshed'. Also, a bistable latch can generally be switched between states much faster than the amount of time it takes to charge or discharge a capacitor. Accordingly, SRAMs are a desirable type of memory for certain types of applications.

SRAM is typically arranged as a matrix of memory cells fabricated in an integrated circuit chip, and address decoding in the chip allows access to each cell for read/write functions. SRAM memory cells use active feedback from cross-coupled inverters in the form of a latch to store or "latch" a bit of information. These SRAM memory cells are often arranged in rows so that blocks of data such as words or bytes can be written or read simultaneously. Standard SRAM memory cells have many variations. The basic CMOS SRAM cell generally includes two n-type (nMOS) pull-down or drive transistors and two p-type (pMOS) load transistors in a cross-coupled inverter configuration, with two additional nMOS select transistors added to make up a six-transistor cell (a 6T cell). Additionally, application specific SRAM cells can include an even greater number of transistors. Since a plurality of transistors are utilized in SRAM requiring matched electrical characteristics, and since pocket shadowing may become more prevalent as transistor widths are reduced, the adverse effects of pocket shadowing may present themselves to a great degree in SRAM, particularly as that type of memory is continually scaled down.

Accordingly, it would be desirable to obtain a technique that would allow symmetrically implanted active regions that compensate for the effects of cross-diffusion in highly scaled transistors, particularly where the transistors may be used in SRAM memory cells.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention is directed to a method of performing a symmetric angle implant (e.g., an LDD implant) that compensates for the effects of cross-diffusion and reduces dose imbalances between matching transistors of an SRAM memory cell (e.g., a 6T SRAM cell). This objective may be accomplished by patterning symmetrically located and closely spaced resist structures on opposite sides of the active regions (e.g., pMOS or nMOS source/drain active regions) along a gate of the cell to equally shadow "laterally opposed" (e.g., rotationally opposite or rotationally offset by about 180°) first and second angled or pocket implants. For example, between the first and second angled implants in the method of the present invention, the wafer may be rotated by about 180°, or the relative orientation between the wafer and the first angled implant may be adjusted either rotationally by about 180°, or may be tilt offset by an appropriate angle that effectively accomplishes the same thing before the second angled implant.

As previously indicated, scaling trends in the semiconductor industry are causing an increase tendency toward device crowding, resist misalignments, as well as in increased cross-diffusion and dose imbalances. By contrast to conventional pocket or angled implant methods which try to minimize such pocket shadowing, the method of the present invention instead, embraces this shadowing tendency, and intentionally seeks to further enhance pocket shadowing using the patterned resist structures. Accordingly, the resist is patterned as close as possible (e.g., to within one overlay error specification) on both or opposite sides of the active regions in order to maximize such shadowing.

Beneficially, the enhanced shadowing provided by these patterned resist structures also tends to equalize or balance the implant dose due to any left or right misalignments of the resist pattern. For example, if the resist pattern is offset to the right, more dopant will be implanted on the left side of an active region in a first implant rotation of the wafer, and a corresponding lesser amount of dopant will be implanted on the right side of the active region in a second implant rotation of the wafer. Therefore, the result of the two implant rotations is that each individual pMOS or nMOS active region tends to receive the same net dose or balanced dose. This improvement is particularly important in SRAM having transistors which often require matched electrical characteristics. Thus, forming the resist on both sides of the active regions of a pair of matched transistors has the advantage that the two transistors are now immune to imbalance due to pocket shadowing, since for any given overlay error, both transistors see the same net shadowing.

In the prior art as well as in the present invention, the pMOS regions are covered with resist during n-type dopant implantation, and the nMOS regions are covered during p-type dopant implantation. However, in the method of the present invention, by narrowing the spacing of the resist on either side of the active regions associated with a gate, more resist may be used over the oppositely doped active regions during LDD and subsequent S/D implants, which increases pocket shadowing and has the effect of compensating for the impact of cross-diffusion. In particular, because cross-diffusion raises $V_t$ and lowers $I_{Drive}$, whereas pocket shadowing lowers $V_t$ and raises $I_{Drive}$, the increased pocket shadowing may be used to compensate for the effects of cross-diffusion between active regions associated with a gate structure.

The present invention in one aspect pertains to forming a pocket implant or angled implant extending under a portion of a transistor gate region using patterned resist structures which symmetrically shadows the implant on opposite sides of the active regions of SRAM cells or where densely packed and/or matched transistors are employed. A resist layer (e.g., used for both first and second implants) is patterned closely on opposite sides of each of the pMOS and nMOS active regions of the device (e.g., the transistors of a semiconductor SRAM cell).

In another aspect, the method further comprises implanting one or more dopant species (e.g., a first implant) at an angle into the memory cell, adjusting the rotational orientation (twist) between the wafer and the first implant by about 180 degrees, and repeating the angled implant (e.g., a second implant).

In yet another aspect, the method is accomplished or repeated for both the nMOS and pMOS active regions.

In still another aspect, the angles of the first and second angled implants are about the same.

In still another aspect, the memory cell comprises an SRAM cell, for example, a 6T SRAM cell, comprising an nMOS and a pMOS transistor.

In another aspect, other implants, such as drain extension implants that are normal or perpendicular to the surface of the wafer may be used that are "nearly perpendicular" and range from about 0 degrees to about 3 degrees from a perpendicular to the surface of the wafer, for example.

In the context of the present invention and for the purpose of discussion, it is generally assumed that one or more angled or pocket implants (e.g., of about 15-45° from a perpendicular to the surface of the wafer) may be employed at each of four orthogonal rotations or twists of the semiconductor wafer. For example, two implants (e.g., first and second implants) of the four angled implants at two of these twists (e.g., 0° and 180°), may be aligned with the axis of the active region and are herein termed "on-axis", while the other two of the four implants and twists (e.g., 90° and 270°) may be aligned perpendicular (normal) to the axis of the active region and are herein termed "off-axis". Thus, each of the two on-axis implants are rotationally 180° apart from each other, and each of the two off-axis implants are rotationally 180° apart from each other relative to the wafer, and in that context are herein said to be opposite or "laterally opposed" to each other.

Although on-axis and off-axis twist angles associated with implants are discussed in the context of the present invention, it is further appreciated that other twist angles may also be utilized including those at (e.g., 45°, 135°, 225°, 315°) angles and other such angles which are neither fully on-axis nor fully off-axis with respect to the axis of the associated active regions. However, as implants associated with such "non-aligned" twist angles may produce various degrees of shadowing and the resultant dopant imbalances at all four twist quadrants, the method of the present invention may still be employed at these non-aligned twist angles to provide symmetric shadowing and affect a balanced implant dose.

Further, the resist changes of the present invention increase the proportion of shadowing of the active regions during off-axis angled implants relative to the shadowing during on-axis implants. In other words, there is a relative increase in the shadowing of the active regions from the adjacent resist feature edges during off-axis implants, while the exposure from on-axis angled implants or from non-angled implants remains substantially unchanged. This effect tends to further improve the dose balance due to any off-axis resist misalignments, because the ratio of dopant exposure obtained on-axis with the active regions increases relative to that obtained off-axis and shadowed by the adjacent resist structures. The resist patterning and angled pocket implant methods of the present invention generally follow standard pattern flow development and precede the resist etch process.

In this manner transistors formed in accordance with one or more aspects of the present invention may yield improved performance when incorporated into various circuit applications, for example, SRAM cells since the probability is increased that such transistors will be more closely matched and exhibit a reduced impact of cross-diffusion.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIG. 5 represents a flow diagram illustrating an exemplary method for performing an angled or pocket implant on the active regions of an SRAM memory cell having symmetric pocket shadowing that provides an equal implantation dose therein to compensate for the effects of cross-diffusion within nMOS and pMOS active regions according to one or more aspects of the present invention.

DETAILED DESCRIPTION OF THE INVENTION

Figures 1A, 1B:
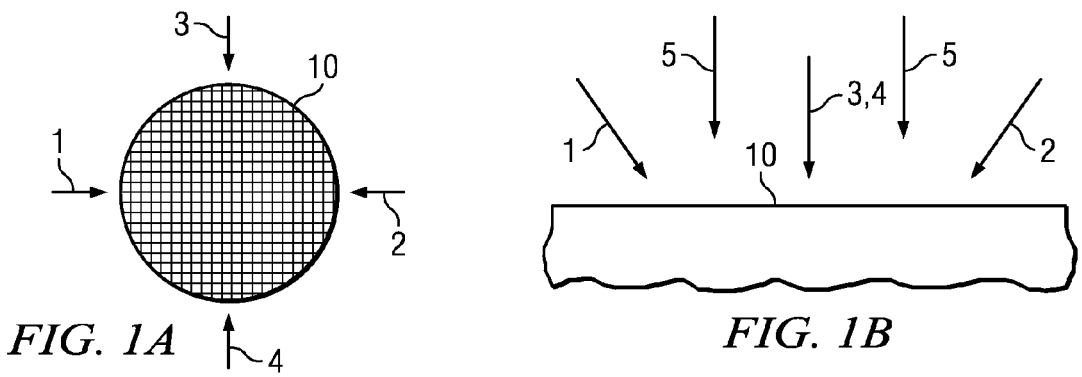
FIGS. 1A and 1B are top plan and side views, respectively, illustrating four quadrants or "twists" of angled or pocket implantations for implanting active regions in a substrate of a wafer such as may be used in accordance with the present invention.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

The present invention pertains to a method of providing an angled or pocket implant within the active regions of the cells of an SRAM memory array having symmetric shadowing in order to compensate for, counter, or negate the effects of cross-diffusion within the polysilicon gate region of the memory cells. As previously indicated, because cross-diffusion raises $V_t$ and lowers $I_{Drive}$, whereas pocket shadowing lowers $V_t$ and raises $I_{Drive}$, the increased and symmetric pocket shadowing used in the present invention is useful to compensate for, or negate the impact of cross-diffusion associated with a gate structure. The method accomplishes this goal by symmetrically patterning resist structures close to opposite sides of the active regions of the cell transistors to provide equal pocket shadowing of the active regions during angled implantations of the SRAM memory cells.

In semiconductor processing and fabrication, cross diffusion results in an undesirable increase in the threshold voltage Vt of transistors. Further, pocket shadowing is often present and causes an imbalance between transistors which are intended to be matched, or between transistors located on the left and right sides of an SRAM memory cell. This is particularly important in the matched transistors of cells of a highly scaled SRAM memory array, because such mismatching may affect the storage capability or the life of data in the array.

Traditionally, efforts are made to minimize both cross diffusion and pocket shadowing, particularly in high density devices. By contrast, however, the method of the present invention intentionally enhances this pocket shadowing using closely patterned resist structures. In particular, the method of the present invention patterns the LDD and the S/D resist layers to form resist structures as close as possible (e.g., to within one overlay error specification) on both or opposite sides of the active regions of the transistors to maximize such shadowing. The single overlay error specification margins discussed relate to the minimum safe distance between the resist edge and the underlying active region that must receive the pocket implant dopant species. Forming the resist on both sides of the transistor also has the advantage that the two such transistors are now immune to imbalances due to pocket shadowing, since for any given resist pattern overlay error, both transistors see the same net shadowing and implant dose. These concepts and benefits are further revealed in association with the following exemplary figures and discussions.

FIGS. 1A and 1B, for example, illustrate four quadrants or "twists" of an angled or pocket implantation for implanting dopants into active regions (e.g., source and drain regions) of a substrate of a wafer 10 (e.g., semiconductor wafer) in accordance with the present invention utilizing a resist mask pattern in the fabrication of SRAM memory cells. Angled or pocket implants 1 and 2, for example, are rotated about 180° from each other (laterally opposed), and are also tilted at an angle relative to the surface of the wafer 10. Similarly, implant rotations or twists 3 and 4 are rotated about 180° from each other, and are also tilted at an angle relative to the surface of the wafer 10. In this way, four angled implants (e.g., at 0°, 90°, 180°, 270°, or 45°, 135°, 225°, 315°) are conventionally utilized at one of each of the four quadrants or "quads" of the available 360° around a wafer to insure adequate dose exposure of all the transistor active regions of a semiconductor device and as masked by the resist pattern. Although the wafer or a platter containing multiple wafers is typically rotated while the implanter beam is held fixed, the implanter could potentially be rotated about the wafer if desired.

In addition, a regular or "normal implant" 5 may also be utilized to implant dopants, wherein the beam impacts the wafer at an angle normal or perpendicular to the surface of the wafer 10. For example, normal implants 5 as well as angled implants 1, 2, 3, 4 to the semiconductor substrate of wafer 10 may be utilized to form low density drain LDD regions therein alongside gate structures for example. The LDD regions are formed by normal 5 or angled implantations 1, 2, 3, 4 using appropriate dopant species atoms through openings in the resist layer. The LDD implant is typically implanted substantially perpendicular to the surface of the substrate or wafer 10 (at a 0° angle), so an unrestricted LDD region width is available as an opening for the LDD implantation.

In some semiconductor cells, all features (e.g., active regions or gates) are oriented in one direction. In such cases, a pair of pocket implants may be used to introduce dopants into both sides of these active regions or under both sides of the gate. These implants may be referred to as "two rotations", from the use of two 90° rotations of the wafer mounting disc in an ion implanter. The features of other semiconductor cells may have multiple orientations, wherein four pocket rotations are typically used to implant both sides of all features substantially equally. Pocket shadowing may occur from any direction, including the directions parallel to, or perpendicular to these features.

In addition to the shadowing problems of closely spaced features from high density integration, "overlay error" due to misalignment and variations in feature dimensions can vary. The smaller this distance, the greater is the effect of pocket shadowing.

FIGS. 2A-2L illustrate an exemplary load-driver arrangement 20 and exemplary LDD and S/D implant operations in the fabrication of such transistors as may be used in a static random access memory (SRAM) cell in accordance with the present invention, wherein resist structures are formed close to and symmetrically located on both sides of the active regions of the transistors to provide equal shadowing and an equal dose from laterally opposed angled implants. The implants, for example, may be utilized for both nMOS and pMOS active regions of the cell.

Figure 2A:
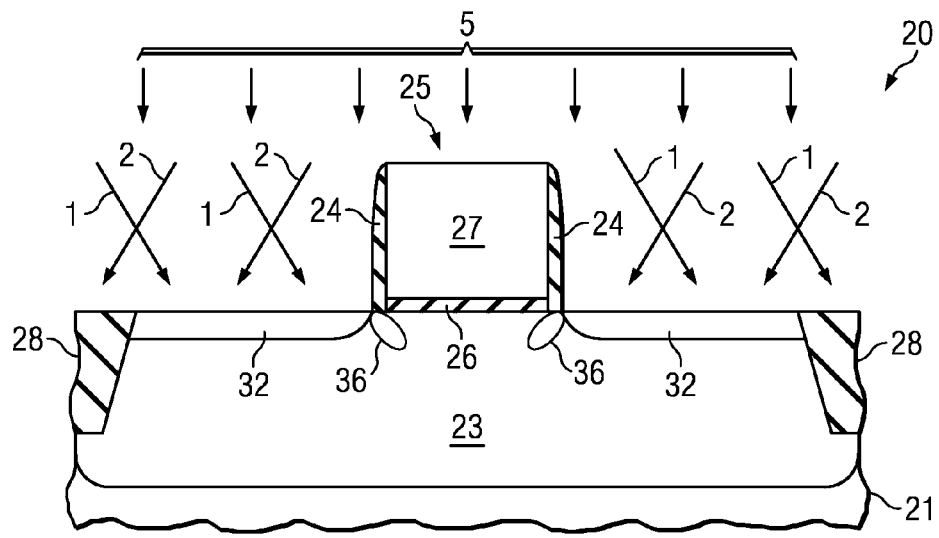
FIGS. 2A-2M are cross-sectional and top plan views illustrating an exemplary load-driver arrangement and exemplary LDD, S/D implant, and anneal operations in the fabrication of such transistors as may be used in a static random access memory (SRAM) cell, wherein resist structures are formed close to and symmetrically located on both sides of the active regions to provide equal shadowing and an equal dose from laterally opposed angled implants, which may be utilized for both nMOS and pMOS active regions of the cell.
Figure 2B:
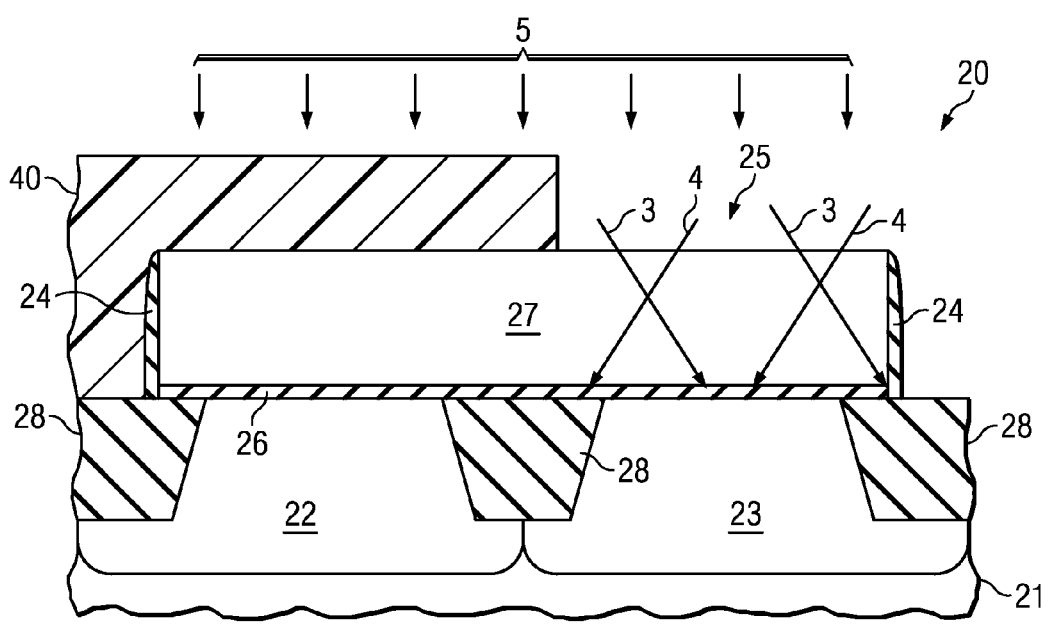
Figure 2C:
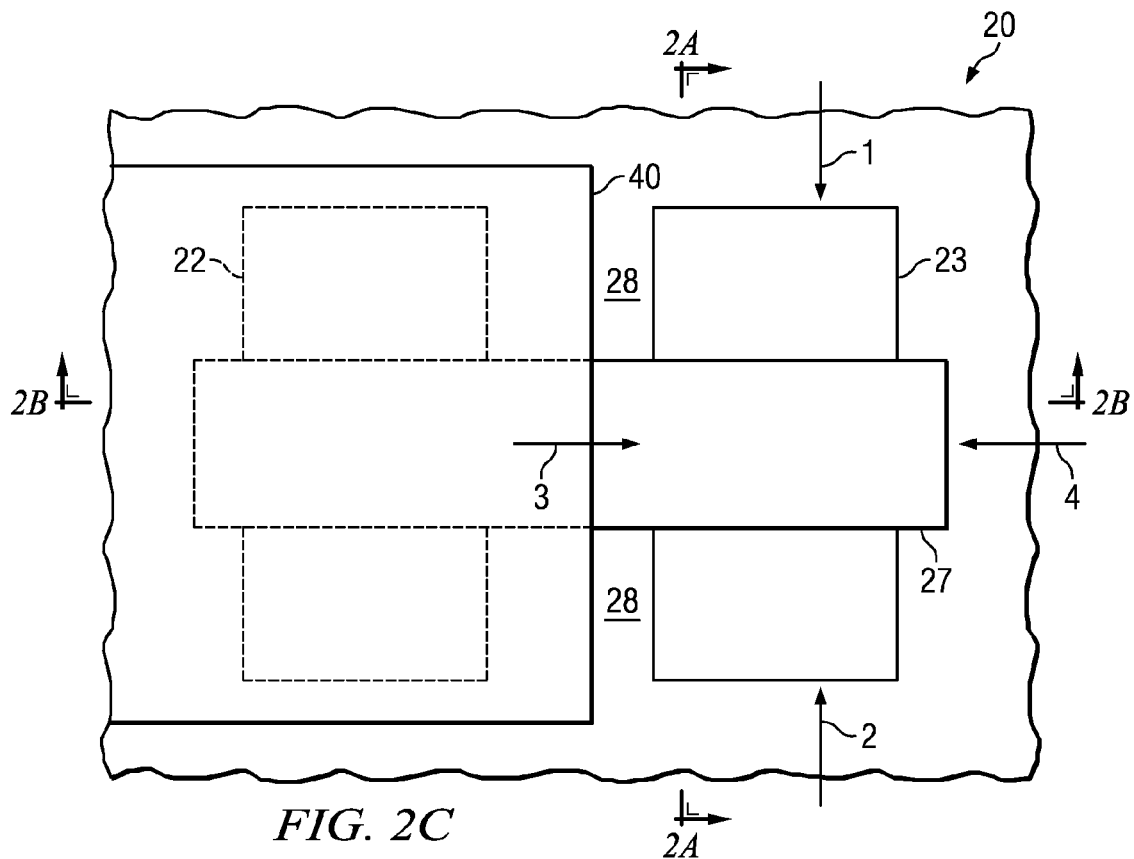

The exemplary load-driver arrangement or structure 20 of FIGS. 2A, 2B, and 2C, for example, comprises a p-type silicon substrate 21 in which pMOS 22 and nMOS 23 active regions are formed, also called a p-well 22 and an n-well 23. The load-driver arrangement 20 further comprises a gate oxide layer 26 grown over the substrate 21, whereon a gate 25 is formed from a polysilicon gate material 27, wherein the gate 25 is shared by the load and driver transistors. The load-driver arrangement 20 further comprises an offset spacer 24 grown, typically, in a thermal oxidation process on lateral sidewalls of the polysilicon gate 25. The active regions 22, 23 are further defined and isolated by shallow trench isolation (STI) regions 28.

Load-driver arrangement 20 further comprises drain extension regions 32, which are formed in the active regions 22, 23 using a perpendicular LDD implant operation 5, that is guided and offset from the gate 25 by the offset spacers 24. An NLDD resist layer 40 is patterned overlying and protecting the pMOS region 22 during implantation of the nMOS region 23 to further guide the perpendicular LDD implant operation 5 and LDD angled or pocket implant operations 1, 2, 3, and 4, forming pockets 36 underlying the edges of the gate structure 25 in the nMOS regions 23.

Figure 2D:
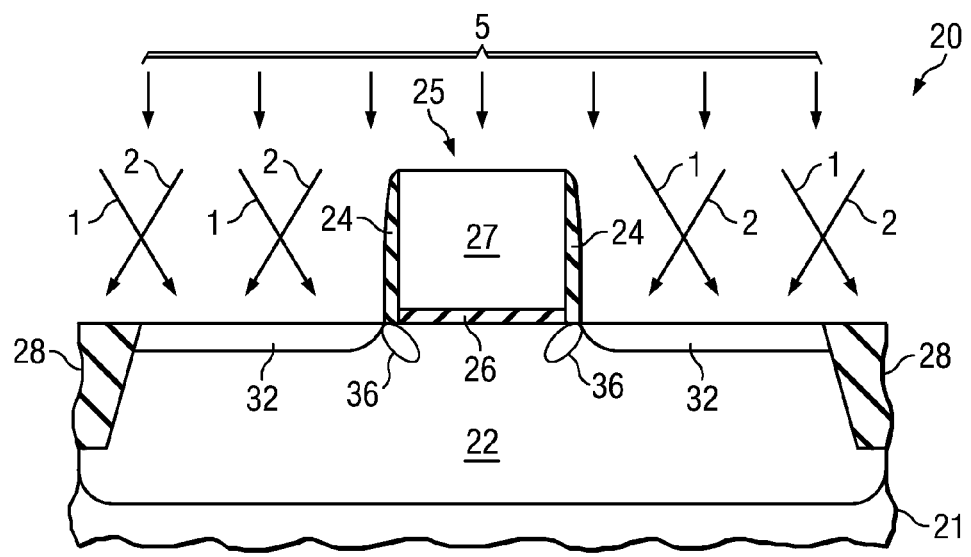
Figure 2E:
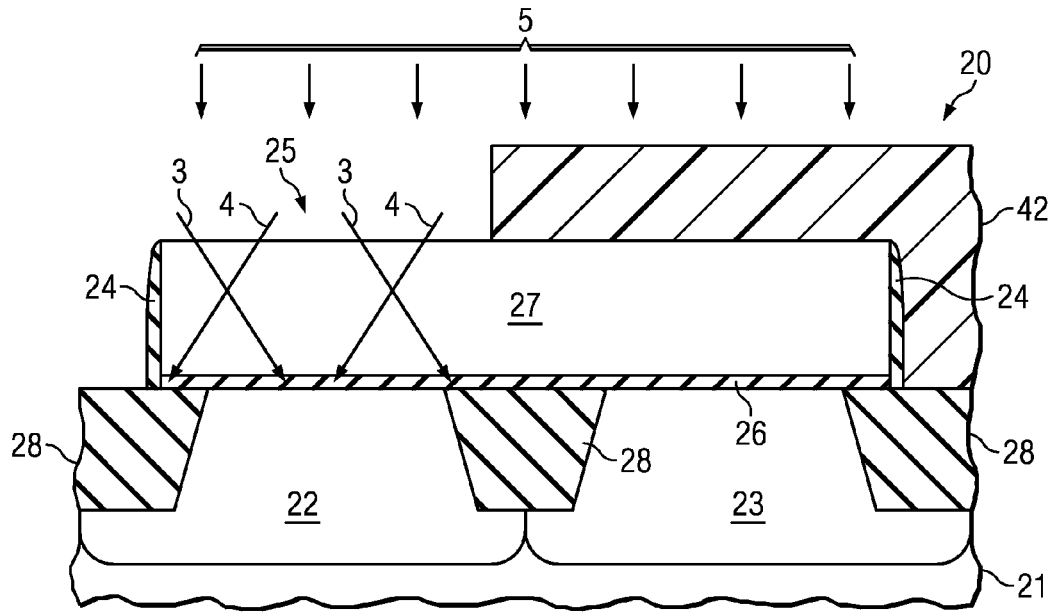
Figure 2F:
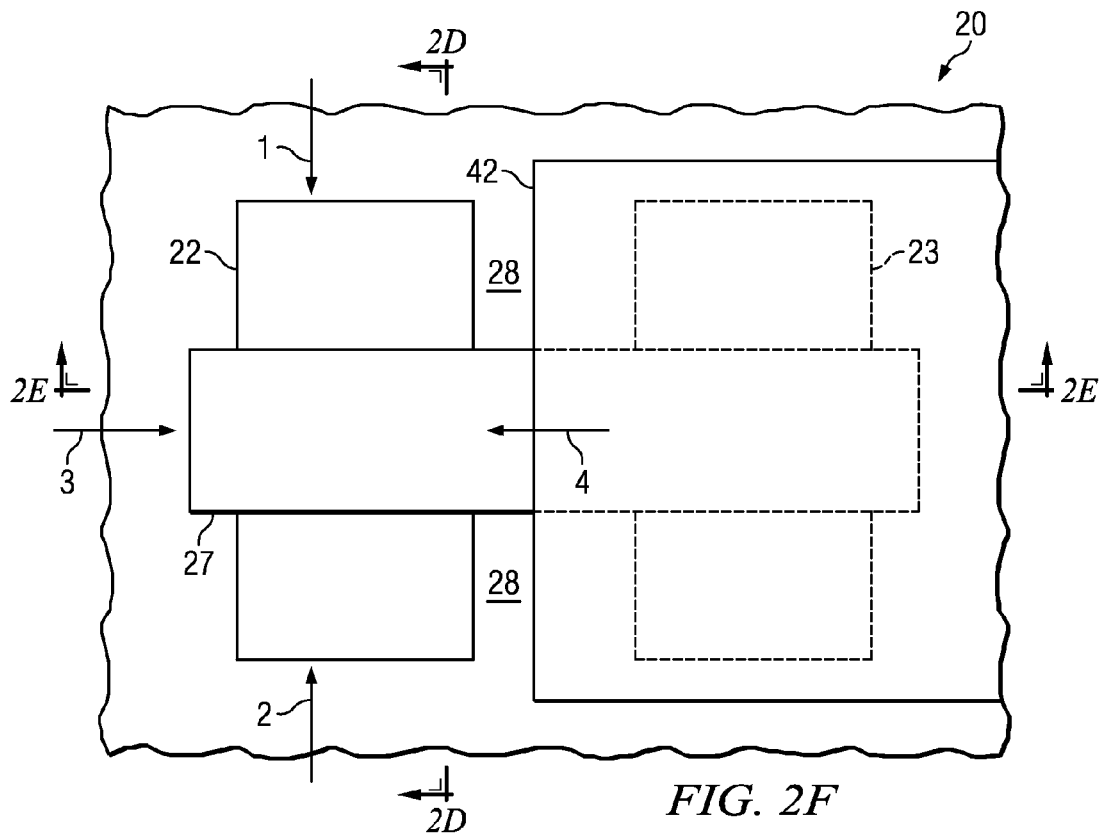

Similarly, FIGS. 2D, 2E, and 2F illustrate the load-driver arrangement 20, with a PLDD resist layer 42 that is patterned overlying and protecting the nMOS region 23 during implantation of the pMOS region 22. PLDD resist layer 42 guides the perpendicular LDD implant operation 5 and LDD angled or pocket implant operations 1, 2, 3, and 4, again forming pockets 36 underlying the edges of the gate structure 25 in the pMOS regions 22.

Figure 2G:
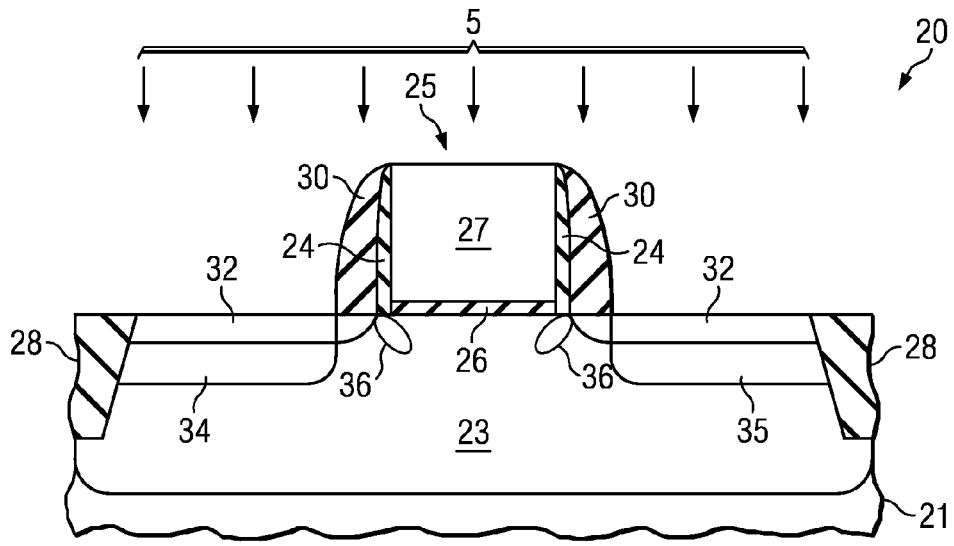
Figure 2H:
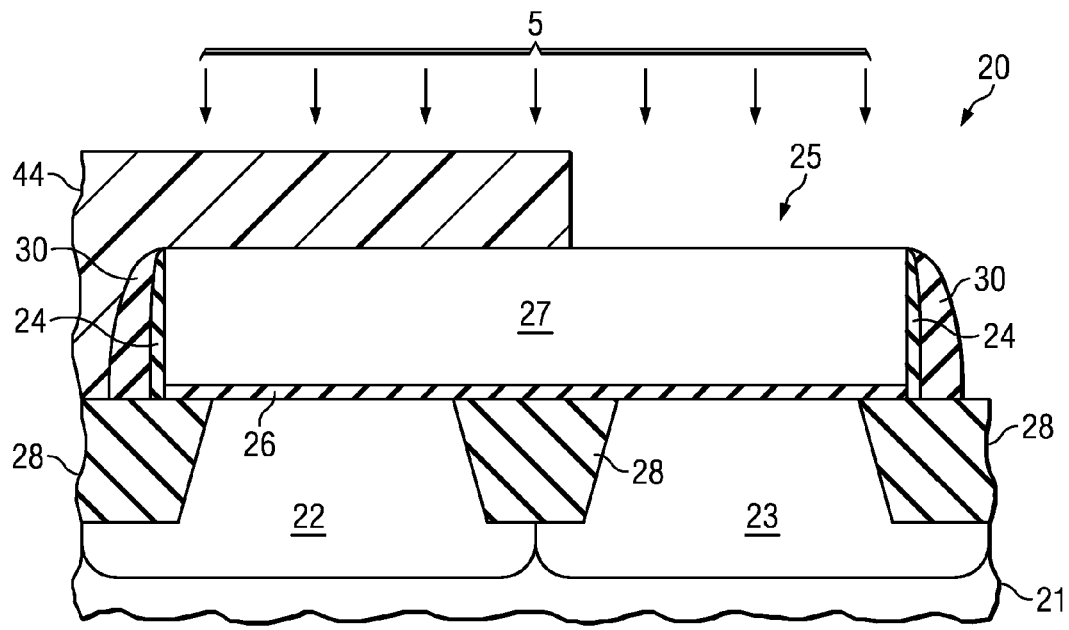
Figure 2I:
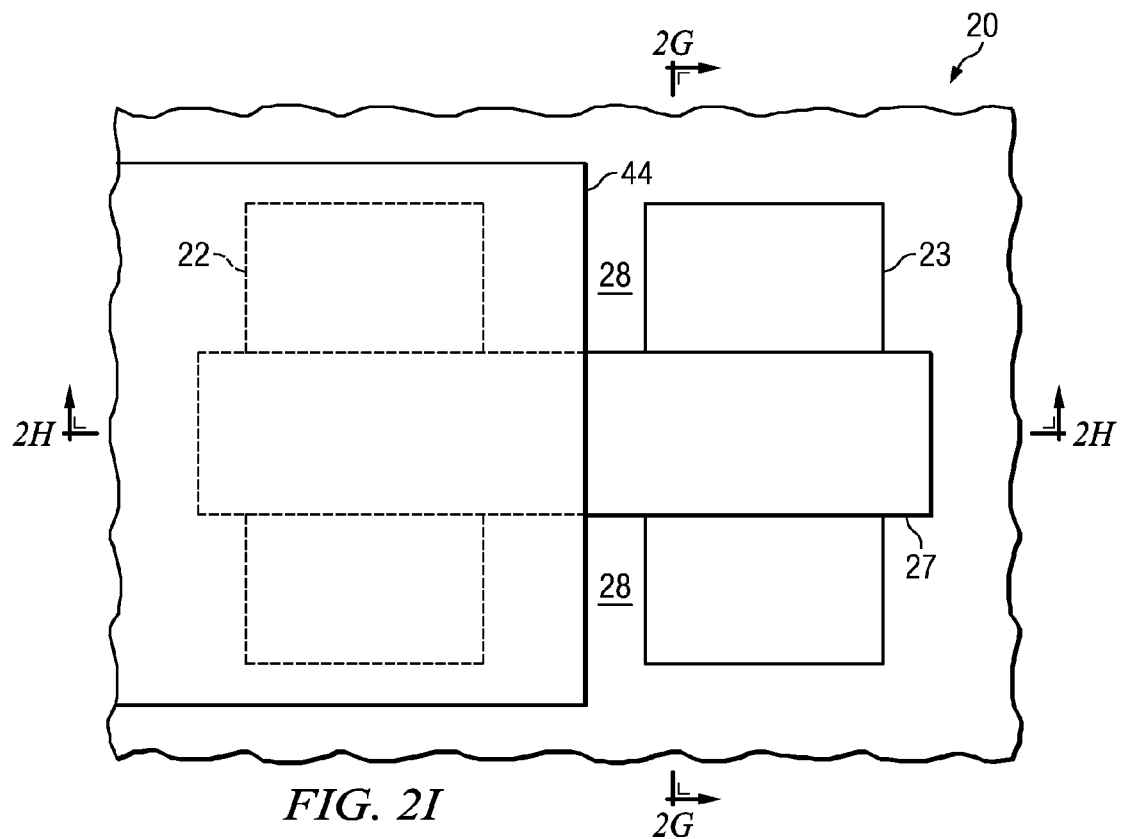

FIGS. 2G, 2H, and 2I illustrate the load-driver arrangement 20, after a sidewall spacer 30 is formed over the lateral sidewalls of the gate 25 and the offset spacers 24 to guide the formation of a deep source region 34 and a deep drain region 35 within the nMOS 23 and pMOS 22 active regions. An NSD resist layer 44 is patterned over the pMOS active region 22 to guide the perpendicular deep source/drain (S/D) region implant operation 5 into the nMOS active region 23, and to protect the pMOS active region 22 from the S/D implant 5.

Figure 2J:
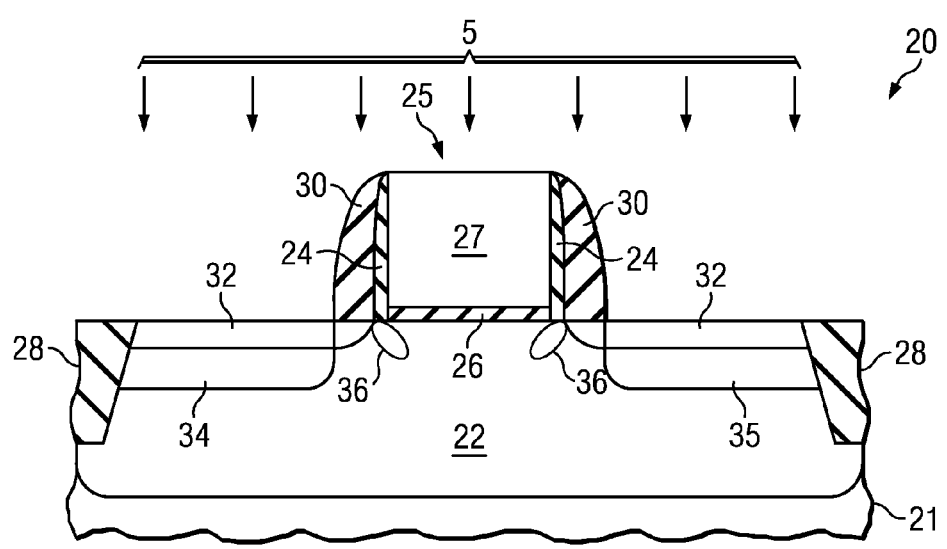
Figure 2K:
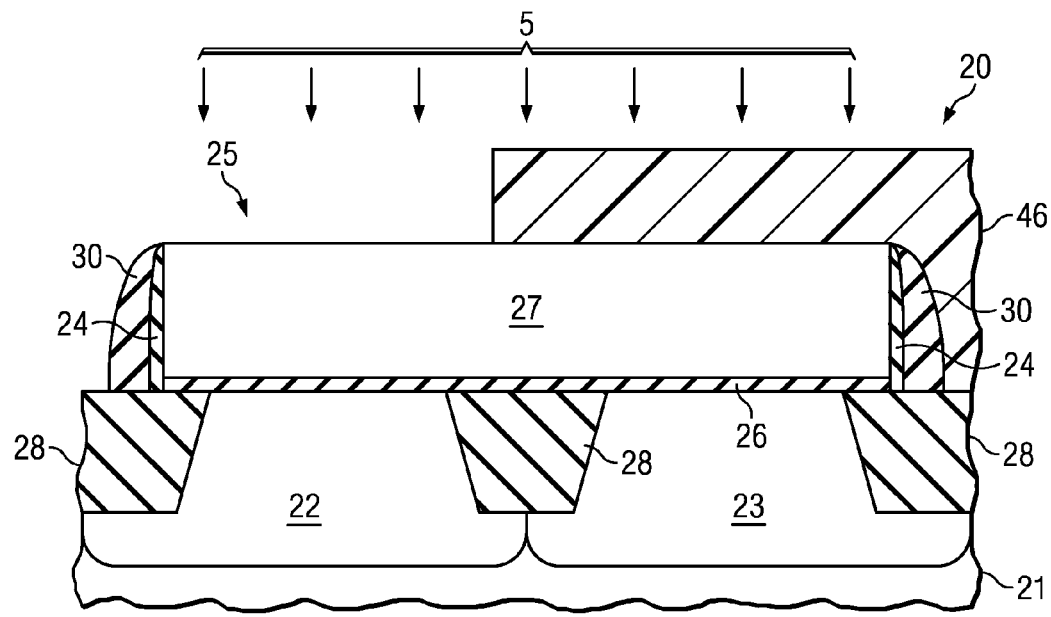
Figure 2L:
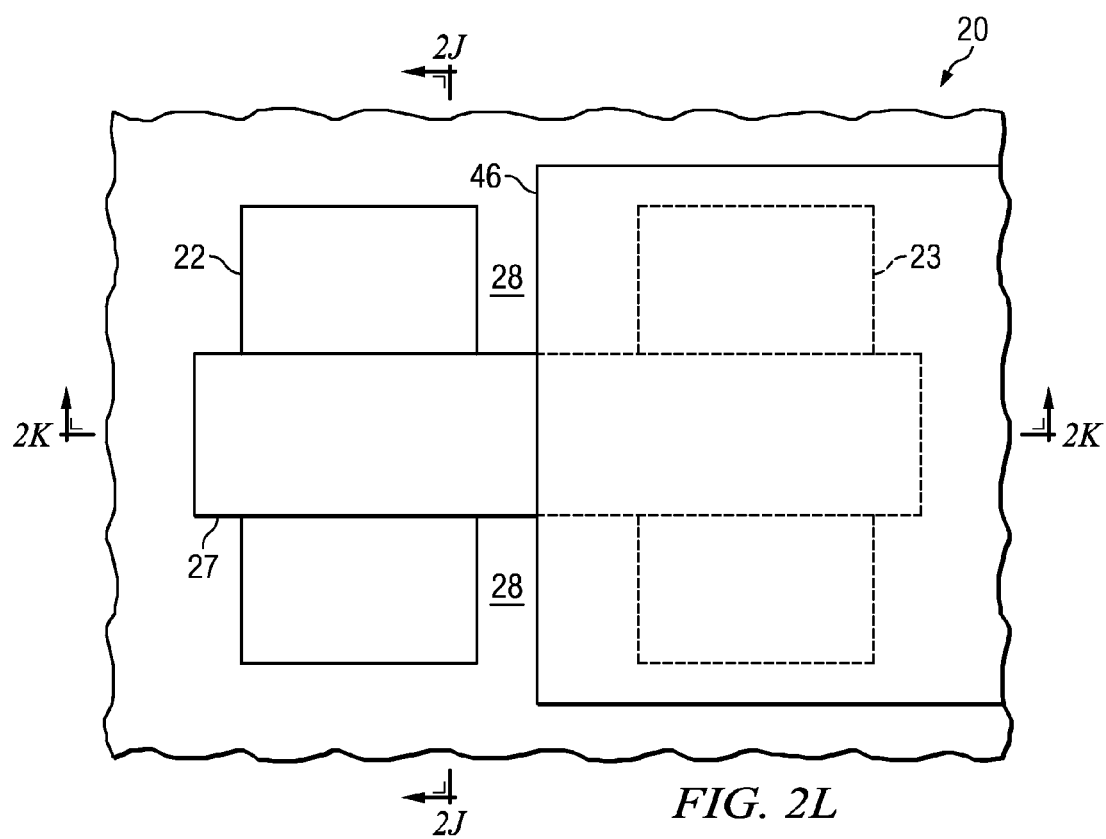

Similarly, FIGS. 2J, 2K, and 2L illustrate the load-driver arrangement 20, with a PSD resist layer 46 that is patterned overlying and protecting the nMOS active region 23 during implantation of the pMOS active region 22. PSD resist layer 46 guides the perpendicular deep S/D implant operation 5 in the pMOS regions 22.

Although implant operations 5 has been described as being perpendicular or at a 0° angle to the wafer, other variations from this angle such as an angle about 0-3° off the perpendicular are also contemplated and have been utilized in accordance with the present invention.

Figure 2M:
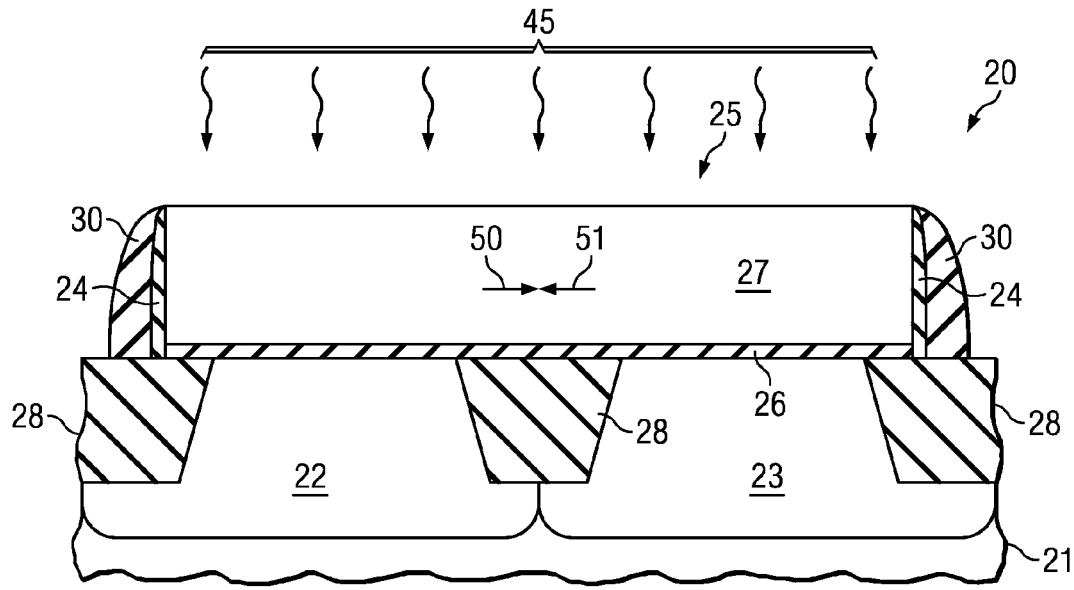

Finally, FIG. 2M illustrates the exemplary load-driver transistor arrangement 20 during an annealing operation 45 in the fabrication of such transistors as may be used in a static random access memory (SRAM) cell.

After dopants have been implanted in the active regions 22, 23 of the load-driver arrangement 20, a subsequent thermal annealing operation 45 is generally performed to allow some diffusion of the dopants in the active regions. However, during this annealing operation 45, cross-diffusion of the dopants also tends to take place within the polysilicon gate 25 overlying these n and p type doped regions in two directions 50 and 51. For example, p-type dopants from the pMOS region 22 cross-diffuse 50 into the nMOS region 23, while n-type dopants from the nMOS region 23 cross-diffuse 51 into the pMOS region 22. As discussed, this cross-diffusion may undesirably raise the threshold voltage $V_t$ and lowers $I_{Drive}$ of the transistors that share the common polysilicon gate region 25.

FIGS. 3A, 3B, 3C, 3D and 3E illustrate an exemplary 6T static random access memory (SRAM) cell 300 such as may be utilized in an array of SRAM memory cells and in association with the methods of the present invention, and wherein several aspects of the invention are presented.

Figure 3A:
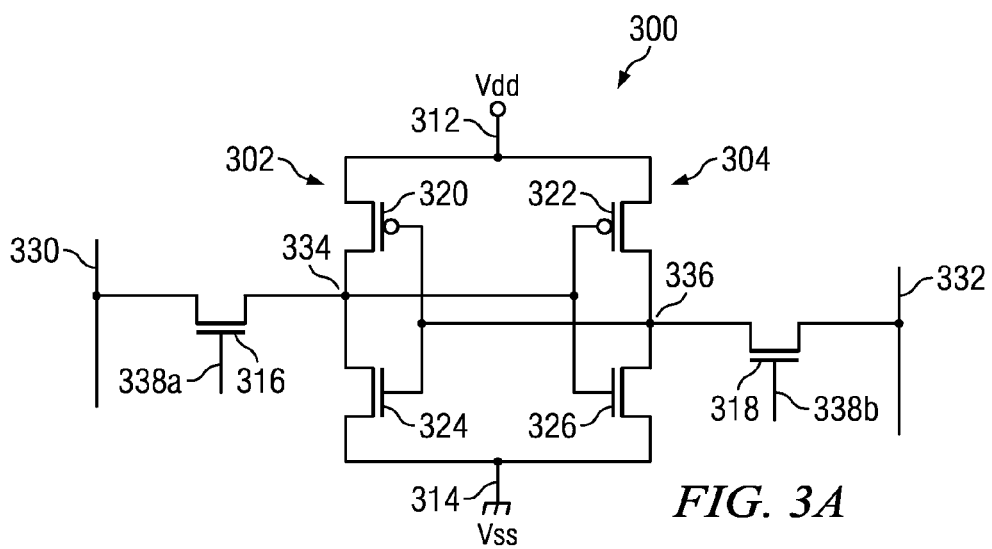
FIG. 3A is a schematic diagram of a conventional 6T static random access memory (SRAM) cell such as may be utilized in the method of the present invention.
Figure 3B:
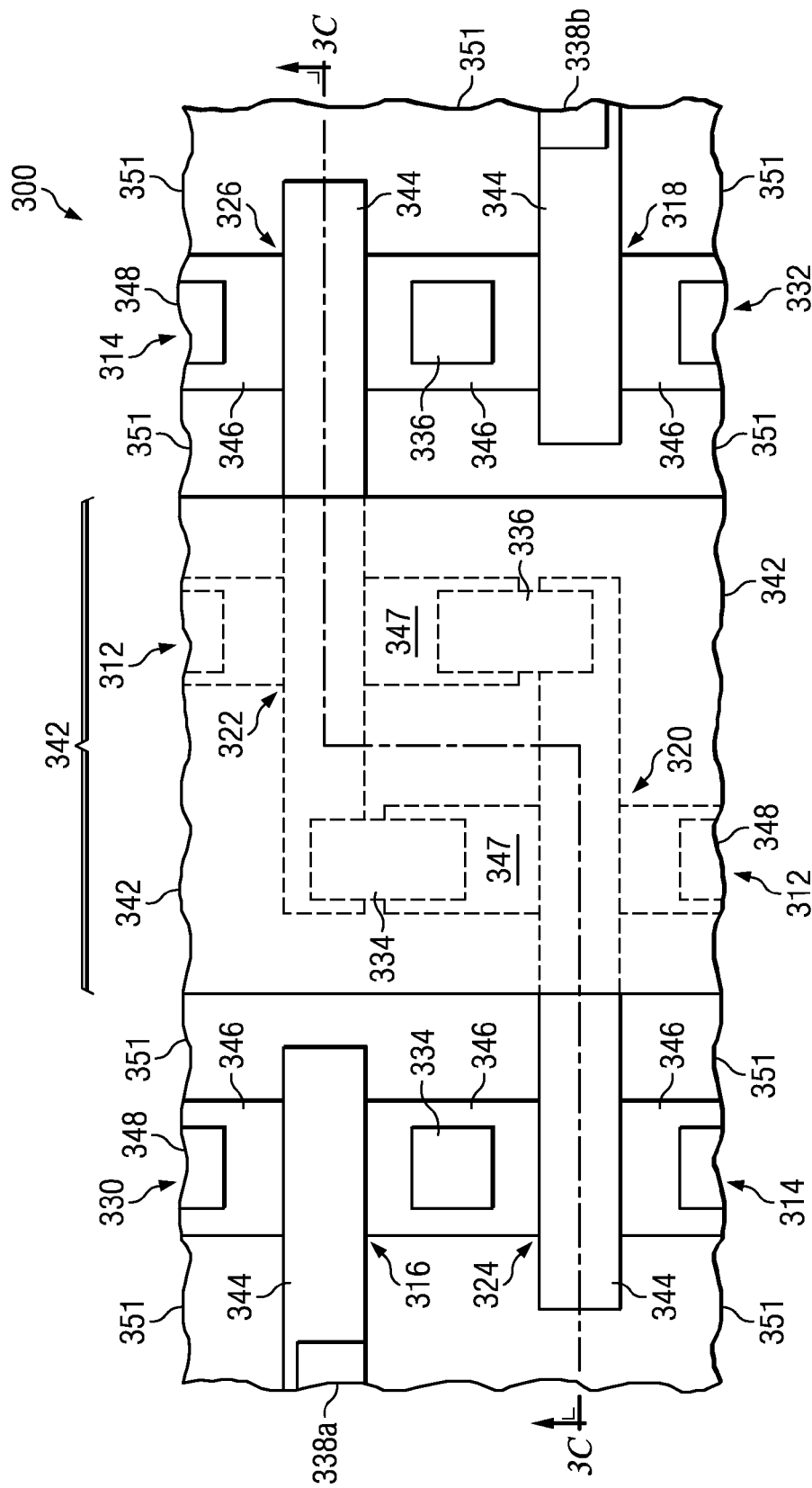
FIGS. 3B-3E are top plan and corresponding cross-sectional side views illustrating conventional NLDD resist patterns and angled implant regions within a substrate of an SRAM cell and the resist positional misalignment and critical dimension issues relevant to the formation thereof during p-type dopant implanting.
Figure 3C:
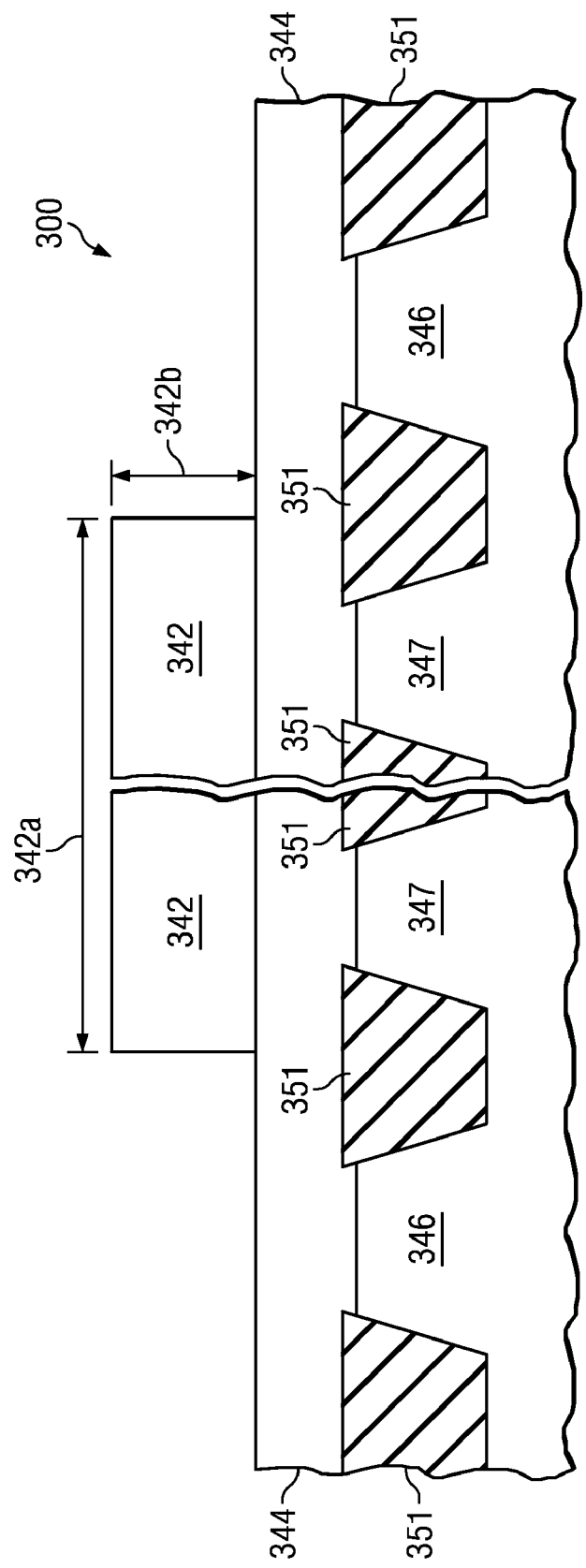
Figure 3D:
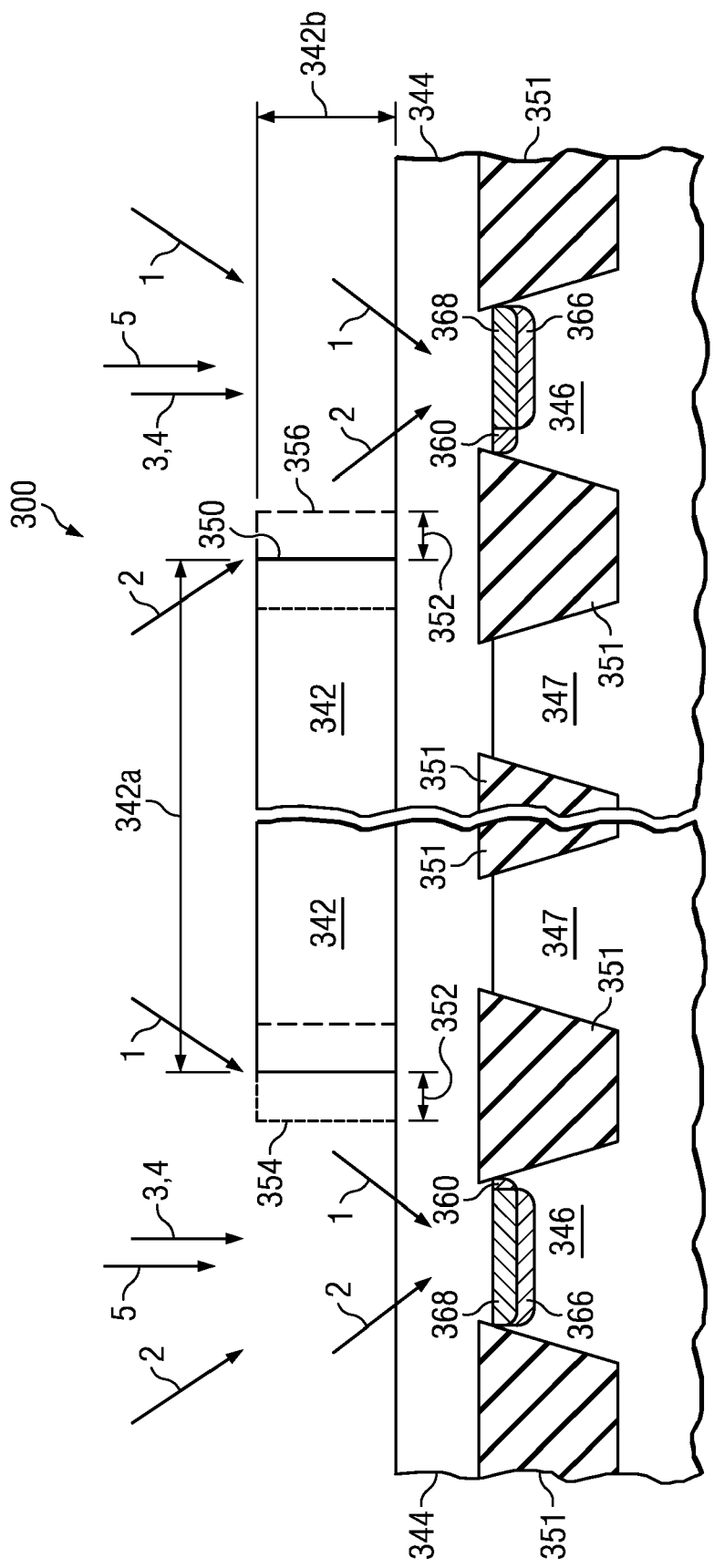
Figure 3E:
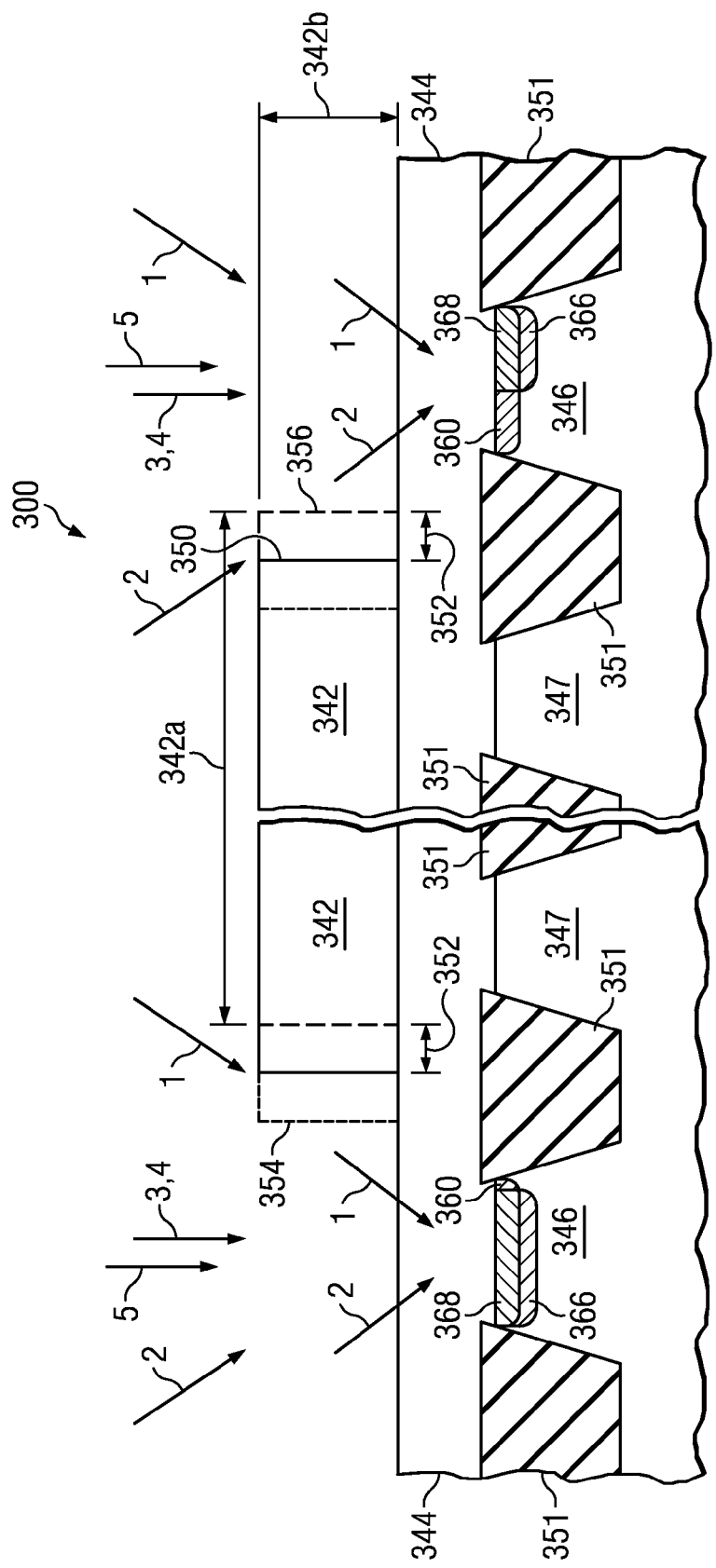

FIGS. 3B-3E are top plan and corresponding cross-sectional side views illustrating conventional NLDD resist patterns and angled implant regions within a substrate of the SRAM cell 300 and the resist positional misalignment and critical dimension issues relevant to the formation thereof during p-type dopant implanting according to several aspects of the present invention. The Dot-dash line running through FIG. 3B represents a break in the composite A-A cross section, as shown in FIGS. 3C, 3D and 3E.

FIG. 3A, for example, illustrates a typical static random access memory (SRAM) cell 300. As illustrated, the SRAM cell 300 generally comprises a pair of cross-coupled inverters 302, 304, generally connected between Vdd 312 and Vss 314 to store a data bit state. SRAM cell 300 further comprises a pair of pass transistors; including pass gate A 316 and pass gate B 318 to read and write a data bit between the cross-coupled inverters; inverter A 302 and inverter B 304, and bitline BL 330 and bitline-bar BLB 332, respectively. Respective inverters 302, 304 comprise a p-type MOS (pMOS) pull-up or load transistors; load transistor A 320 and load transistor B 322, and an n-type (nMOS) pull-down or driver transistor A 324 and driver transistor 326. Pass gate transistors 316, 318 are generally n-type as well, having gate leads WL 338a and WL 338b generally connected to, and controlled by the same wordline WL 338 (not shown).

This type of SRAM cell comprises six transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.).

In general, SRAM cells are more stable and have better data retention where the respective pMOS (320, 322) and nMOS (324, 326) transistors are matched for the two inverters (302, 304). However, as dimensions are continually reduced to scale down devices, pocket shadowing can become an issue that adversely affects transistor matching characteristics.

In SRAMs, a small cell size is of paramount importance for increased storage density and other associated reasons. As a result, it is important to reduce various dimensions in the SRAM cell, typically dictated by the use of a resist layer (e.g., NLDD resist layer 342) as a mask for patterning the various reduced elements of the cell. When the nMOS LDD and corresponding pocket implants (e.g., using implant rotations 1, 2, 3, or 4) are being performed, an NLDD resist pattern 342 is used covering the pMOS transistors or pMOS active regions 347 having poly layer 344, as shown in FIGS. 3B, 3C, 3D and 3E. Since it is desirable to minimize pocket shadowing and transistor feature sizes, the resist width 342a and resist height 342b of the NLDD resist 342 of FIG. 3C are typically minimized in the conventional resist patterns and methods illustrated in association with SRAM cell 300.

Isolation regions, for example, shallow trench isolation regions STI 351 separate nMOS transistors or active regions 346 from the pMOS transistors or active regions 347. Since resist layer 342 must mask the pMOS active regions 347, and also not shadow much of the nMOS active region 346, the edge of the resist 342 is often located somewhere midway between these active regions 346, 347, thus the margin of protection for both these regions by the resist 342 is minimal. As shown in FIG. 3D, for example, the left edge of resist 342 may shadow the left nMOS 346 from rotation 1 of a pocket implant while sheltering the left pMOS active region 347 from rotation 2 of a pocket implant. Likewise, the right edge of resist 342 may shadow the right nMOS 346 from rotation 2 of a pocket implant while sheltering the right pMOS active region 347 from rotation 1 of a pocket implant. Both right and left nMOS and pMOS transistors are therefore affected by the resist position and size. In the context of the present discussions, implant rotations 1 and 2 refer to pocket implants that are perpendicular to the axis of the active regions 346 and 347, while implant rotations 3 and 4 refer to implants that are parallel to or axially aligned with the active regions 346 and 347.

In a normal alignment position 350 (solid line) of resist 342, if the resist height, the shape of its right and left corners, and the left/right position of the resist edges relative to the underlying active regions 346, 347 are the same (symmetrical), then both left and right nMOS transistors 346 and pMOS transistors 348, respectively, will be affected equally. Ideally then, the left and right transistors of the SRAM cell will at least be matched and ideally will receive symmetrical pocket implant dose levels as are shown in FIG. 3D when resist mask 342 is in the normal alignment position 350.

FIG. 3D further illustrates that these symmetrical conditions may occur, for example, when the nMOS active regions 346 are to receive the NMOS pocket implant 360 from rotations 3 and 4 (parallel with or axially aligned with the nMOS active regions 346), and NMOS pocket implant 366 from rotations 1 and 2 (perpendicular to the axis of active regions 346 and 347, and to the axis of the gate). With the resist structure 342 in the normal alignment position 350, as illustrated in FIG. 3D, NMOS pocket implant 366 tends to be formed more heavily further away from the NLDD resist structure 342 at the outer edges of both the left and right implants 366. This is because only the inner portions of each implant 366 closest to the edges of the NLDD resist 342 may experience shadowing. Therefore, the total dose of an implant is generally greatest and deepest in those areas where both implants 360 and 366 occur, such as in combined implant regions 368.

Thus, when an ideal central resist alignment 350 is achieved, the pocket implants 366 are formed symmetrically or uniformly within the nMOS regions 346. In this resist position, for example, an outer portion of pocket implant 366 is fully formed from implant rotations 1 and 2 without the effects of pocket shadowing, while a smaller inner portion of pocket implant 366 is formed from implant rotations 1 and 2. For example, during implant rotation 1, the left edge of resist 342 partially shadows the right side of implant 366, and during implant rotation 2, the right edge of resist 342 partially shadows the left side of implant 366.

However, as shown in FIG. 3E, the resist 342 is subject to a misalignment error of the overlay, termed "one overlay error specification" as determined by several variables of the equipment and tools used in forming and locating the resist pattern. FIG. 3E, for example, illustrates the effect on the pocket implants 360 and 366 when the resist 342 is misaligned in position 354. For example, if the resist 342 is misaligned by one error specification toward a left misaligned position 354 (left side dotted line), the resist edge will be closer to one nMOS (e.g., left nMOS 346) and farther away from the other (e.g., right nMOS 346). Likewise, if the resist 342 is misaligned by one error specification, toward a right misaligned position 356 (right side dashed line), the resist edge will be closer to one nMOS (e.g., right nMOS 346) and farther away from the other (e.g., left nMOS 346). As a result, one nMOS transistor or active region will suffer more pocket shadowing than the other. Not only will pocket shadowing be more severe for the nMOS toward which the resist is misaligned (e.g., left nMOS 346), but also there will be a dopant difference (mismatch) that results between the left and right transistors, which is itself detrimental to SRAM cell 300 performance.

A difference in dopant concentration due to uneven pocket shadowing can, for example, result in limited drive current. When the drive current gets limited, the speed at which a memory cell can be accessed may be reduced, for example, and the time it takes to write to the cell may also be somewhat increased. Similarly, pocket shadowing in transistor fabrication can also lead to undesirable variations in threshold voltage (Vt) caused by cross-diffusion (e.g., 50 and 51 of FIGS. 2H and 2K), particularly during source/drain implantation within those active regions which share a common polysilicon (poly) gate region (e.g., 25 of FIGS. 2A-2L). And, as previously mentioned, SRAM that incorporates 'mismatched' transistors can be adversely affected by operating characteristics that vary from transistor to transistor. For example, such SRAM may be unstable and not retain the desired bit state (e.g., a logic 1 instead of a logic 0 or vice versa).

FIG. 3E further illustrates one example of the uneven doping and mis-matching which may occur with resist misalignment with the conventional resist mask or patterning method. For example, the application and patterning of the NLDD resist layer 342, provides a critical dimension (CD) width 342a whether in the normal alignment position 350 or in the exemplary left or right misaligned positions 354, 356, respectively, as shown in FIG. 3D. Narrowing the resist width 342a to a reduced resist width may offer one solution to minimizing pocket shadowing by increasing implantation exposure to rotation 2 on the right side of resist 342 and to rotation 1 on the left side of resist 342. However, narrowing the resist width 342a must also be limited so as to not permit dopant diffusion into the pMOS transistors 347 otherwise covered with NLDD resist 342, not to uncover the pMOS 347, particularly with the maximum possible misalignment of the resist 342.

In the context of the present discussions, implant rotations 1 and 2 refer to pocket implants that are perpendicular to the axis of the active regions 346 and 347, while implant rotations 3 and 4 refer to implants that are parallel to or axially aligned with the active regions 346 and 347. These conditions may occur, for example, when the nMOS active regions are to receive the NMOS pocket implant 360 from rotations 3 and 4 (parallel with or axially aligned with the nMOS active regions 346), and NMOS pocket implant 366 from rotations 1 and 2 (perpendicular to the axis of active regions 346 and 347, and to the axis of the gate). With the arrangement of the resist structure 342 illustrated in FIG. 3D, NMOS pocket implant 366 tends to be formed more heavily further away from the NLDD resist structure 342 at the outer edges of the left and right implants 366, because only the inner side of each implant 366 closest to the edges of the NLDD resist 342 experiences shadowing, thus the pocket implants 366 are non-symmetric or non-uniform within the nMOS regions 346. For example, on the left side of the resist structure 342, an outer portion of pocket implant 466 is fully formed from implant rotations 1 and 2 without the effects of pocket shadowing, while a smaller inner portion of pocket implant 366 is formed from implant rotations 1 and 2 on the left side because rotation 1 is partially shadowed by the left edge of resist 342. Additionally, with resist misalignment, the left and right transistors will become further imbalanced or mismatched, and the inner and outer pocket imbalance will tend to become still more exaggerated. Note, that the drain extension implants as well as the pocket implants for the NMOS are done after the NLDD implant.

In FIG. 3E, it will be appreciated that implantation for the active regions (e.g., 346 and 347) will, in other rotations of the angled implants, be in front of, and behind the poly layer 344.

Figure 4A:
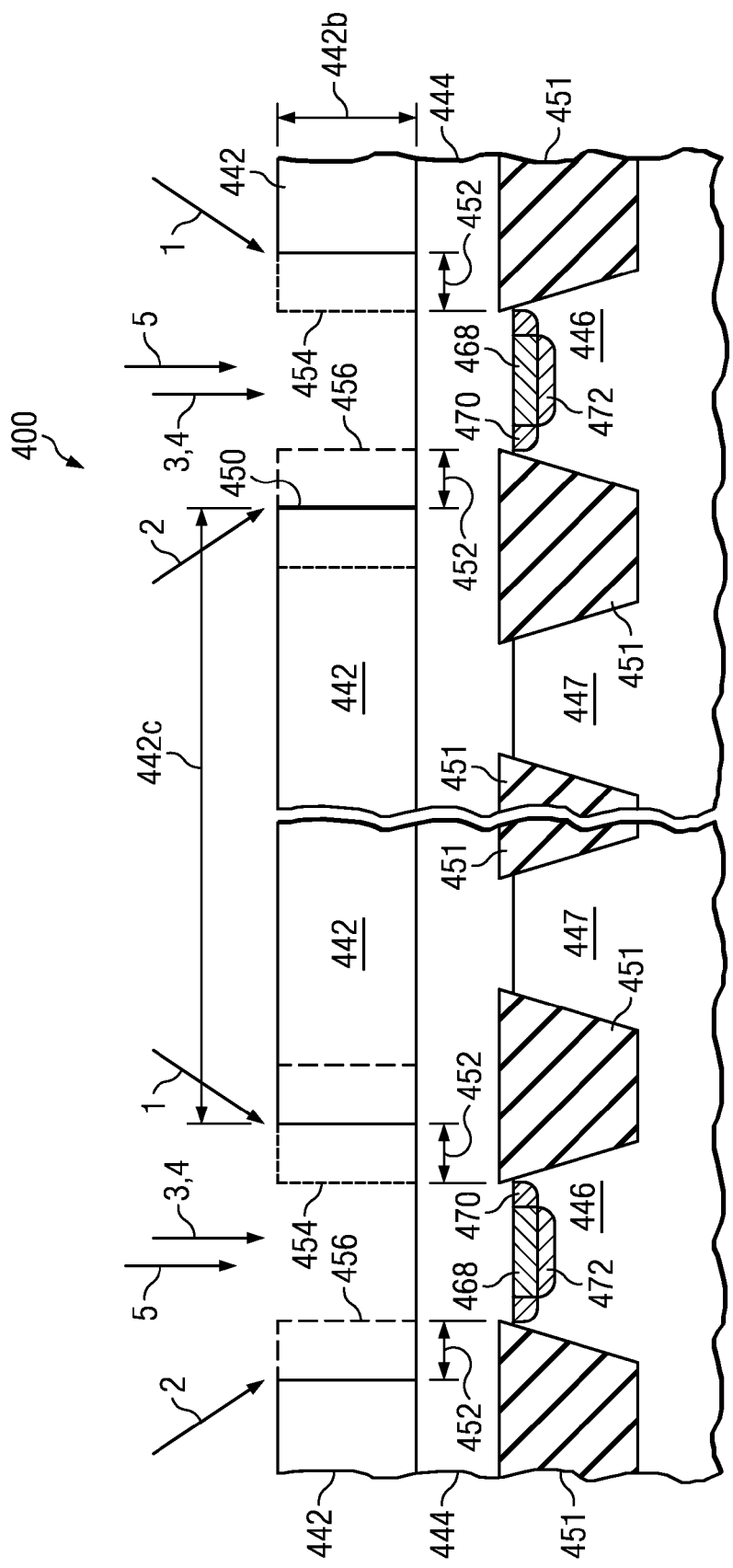
FIGS. 4A and 4B is a cross-sectional view illustrating an exemplary modified resist layer and resist structures formed thereby overlying gate and active regions in a transistor, wherein the resist structures are formed close to and symmetrically on both sides of the active regions to provide equal shadowing and an equal dose from laterally opposed angled implants, which may be utilized for both nMOS and pMOS active regions of the cell according to one or more aspects of the present invention.
Figure 4B:
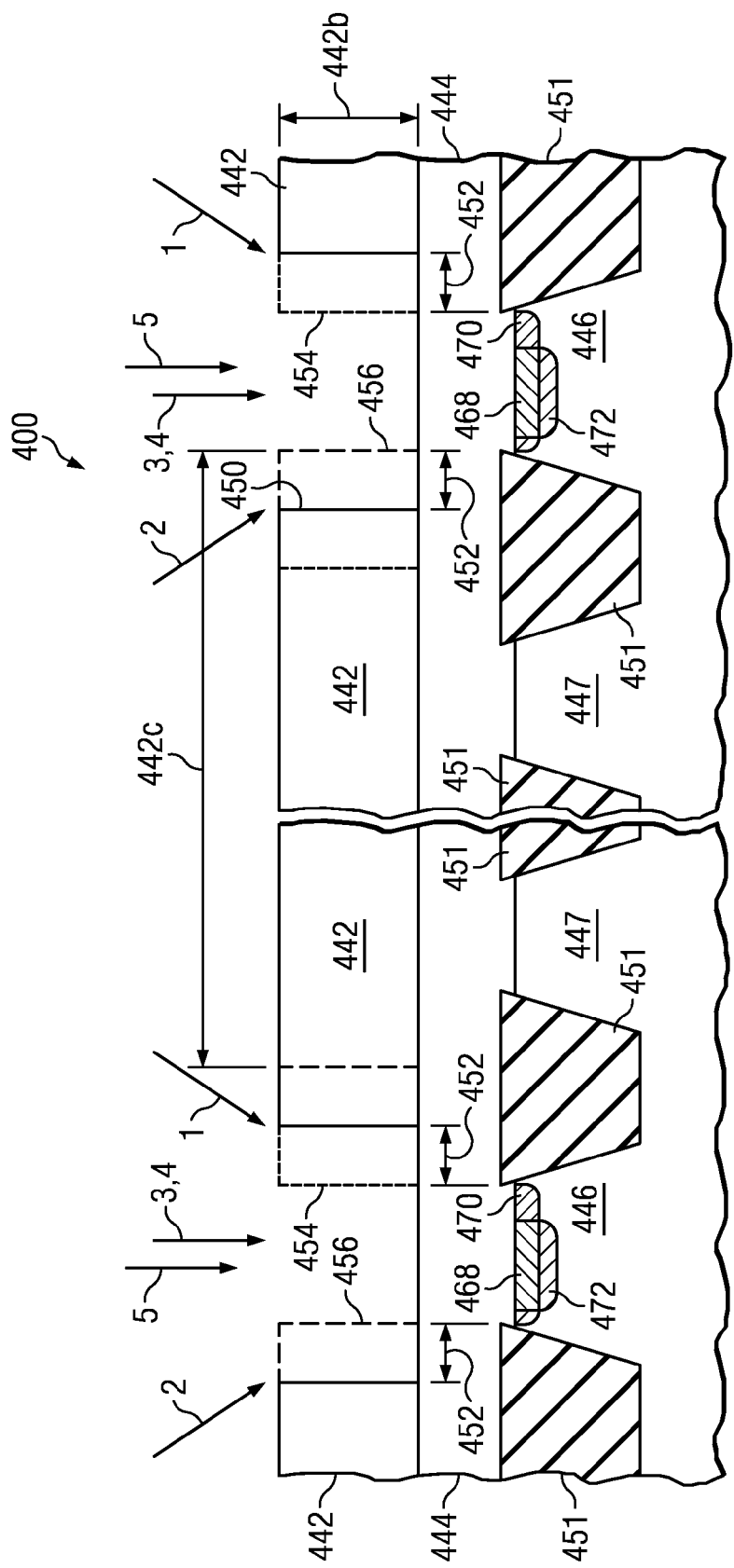

FIGS. 4A and 4B illustrate an SRAM cell 400 having an exemplary modified resist layer and resist structures formed thereby overlying gate 444 and active regions 446, 447 in the transistors of the cell 400 according to one or more aspects of the present invention. In SRAM cell 400, the resist structures, for example, NLDD resist structures 442, are formed close to and symmetrically located on both sides of the active regions. These symmetrically formed resist structures 442 provide equal or symmetric shadowing and an equal dose from laterally opposed angled implants (e.g., angled or pocket implant rotations 1 and 2, or 3 and 4), which may be utilized for both nMOS active regions 446 and pMOS active regions 447 of the cell according to one or more aspects of the present invention.

The contributors to the present invention have appreciated that the prior art imbalances and non-uniformities of the implant processes were caused by resist shadowing which was non-symmetrical or only on one side of the active regions 446 and 447, thus the prior art resist patterning may be termed a "single sided" resist. Accordingly, the inventors realized that to achieve symmetric implantation, what is needed is equal shadowing on both sides of each of the active regions 446 and 447, for example, or the use of "double-sided" resist patterning.

In addition, by further narrowing the resist openings for the active regions, for example, to within one overlay error specification 452 of the edge of the applicable active region (e.g., 446, 447), pocket shadowing may be increased further. This modification limits the relative effect and extent of off-axis pocket implants (e.g., pocket implant rotations 1 and 2), compared to the axially aligned pocket implant rotations (e.g., pocket implant rotations 3 and 4), which are both orthogonal (e.g., at 0°, 90°, 180°, 270°) to the active regions and features of the wafer 10. The inventors further appreciate that if the pocket implants are non-orthogonally aligned (e.g., at 45°, 135°, 225°, 315°) or are otherwise not fully aligned to the active regions and features on the wafer, that the method of the present invention will still beneficially tend to limit the more off axis implants relative to those which are more axially aligned. Thus, a more symmetrical pocket implant dose may be achieved utilizing the several aspects of the present invention.

For example, FIG. 4A illustrates the symmetric dose produced by pocket implant rotations 1, 2, 3, 4. Again, axially aligned pocket implants 3, 4 and 5 produce an even and uniform NLDD dose in NMOS pocket implant 470 in nMOS active regions 446. Then, during the off-axis pocket implant rotations 1 and 2, NMOS pocket implant regions 472 are now produced approximately equal in size, because a resist structure is formed symmetrically on both sides of each active region (e.g., on the left and right sides of the initial NLDD resist structure 442). Where both implants 470 and 472 occur, the total dose is generally greatest and deepest in combined implant regions 468. Further, with misalignment 454, 456 of the resist 442, as shown in FIG. 4B, all edges (e.g., left and right edges of the resist 442) will move together as one pattern, such that if the left side nMOS 446 gets less dose from rotation 1, then that same area will get more dose from rotation 2, thereby generally equalizing the total dose within that area, and other such areas implanted similarly.

Because the openings for the resist 442 are made as narrow as the overlay pattern will allow, for example, to within one overlay error specification 452 of the edge of the applicable active region, the pMOS active regions 447 will also benefit from increased resist coverage (to a resist width 442c) and will therefore avoid diffusion into pMOS active regions 447. Accordingly, the combined implant regions 468 formed on either side of the resist structures, and particularly those sharing a common gate structure, are more closely matched in size using the method of the present invention. Thus, the conventional tradeoff between blocking implants from active regions of opposite polarity and reducing pocket shadowing is avoided in accordance with the present invention, while allowing for further device scaling trends.

Therefore the resist patterning method of the present invention provides a uniform pocket implant while avoiding the negative impact of cross-diffusion by creating equal double-sided shadowing for the active regions and narrowing the implant openings for angled pocket implantation. Transistors fabricated in accordance with one or more aspects of the present invention thus yield improved performance and stability when incorporated into SRAM or other circuits due to the increased likelihood that the transistors will be more closely matched.

The position of the resist (e.g., 450, 454, or 456) relative to the edge of the active, the resist height 442b, and the angle of the pocket implant (e.g., rotations 1, 2, 3, 4) will all obviously contribute to the length of the shadow or the degree of pocket shadowing experienced by a transistor of an SRAM device. As each of these factors may affect the extent of pocket shadowing, the final dose and imbalances thereof will also be affected. For example, if the final resist position 454 is significantly close to the active 446, and the resist height 442b is high, and the pocket implant (e.g., rotation 1 and 2) has a low angle, the extent of the pocket shadowing will be great. Conversely, if the resist is positioned relatively far from the edge of the active area, the resist height 442b is low, and the angle of the pocket implant is large, the extent of pocket shadowing will be relatively smaller. Such factors affecting pocket shadowing are well understood in the art, and as such need no further explanation in the context of the solutions presented herein.

Since the position of the resist is subject to alignment variations and resist line width variation, the design solutions of the present invention, require that the scheme presented works over a range of resist line widths and alignment that is determined by the patterning control capability of the technology. Thus, the present invention may assume a selected resist thickness 442b and a known or fixed implant angle (theta) provided in the four rotations 1, 2, 3, and 4 previously discussed.

Although a pMOS active region 447 covered by an NLDD resist 442 during n-type implantation of an nMOS active region 446 has been described herein, it will be appreciated that an nMOS active region 446 covered by a PLDD resist 482 during p-type implantation of an pMOS active region 447 may also be accomplished in accordance with the invention, as will be discussed further in association with FIGS. 7C, 7D, 7E, 7F, or in order to complete the nMOS and pMOS implantations typically required of SRAM memory cells.

Accordingly, turning to FIG. 5, an exemplary methodology 500 is illustrated and hereinafter described for forming a uniform pocket implant in SRAM memory cells, which minimizes the effects of cross-diffusion and maximizes pocket shadowing where densely packed and/or matched transistors are employed using narrowed resist openings. Transistors (e.g., 416, 418, 420, 422, 424, 426 of FIG. 3A) formed in accordance with one or more aspects of the present invention may be utilized in a static random access memory (e.g., SRAM 400 of FIG. 4) to facilitate stability, among other things, within the SRAM. While the method 500 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts depicted herein may be carried out in one or more separate acts or phases. Additionally, while the discussion herein is with made with reference to SRAM, it is to be appreciated that one or more aspects of the present invention may have application to different types of memories and/or to other structures or circuits not illustrated or described herein.

Initially at 510, a layer of resist material (e.g., NLDD resist 442 of FIG. 4, or PLDD resist 482 of FIGS. 7C, 7D, 7E, 7F) is developed (e.g., resist is applied and patterned) overlying, for example, a polysilicon layer (e.g., gate polysilicon layer 444) and active regions (e.g., nMOS 446 or pMOS 447) and isolation regions (e.g., 451) of an SRAM memory cell (e.g., an SRAM device 400) in a substrate, symmetrically forming the resist structures (e.g., NLDD resist 442 or PLDD resist 482) on opposite sides of the active regions (e.g., 446 or 447). At 520 one or more dopant species (e.g., n-type or p-type) are implanted into one of the respective active regions (e.g., 446 or 447) in a first angled implant (e.g., pocket implant rotation 1) using the resist structures (e.g., NLDD resist 442 or PLDD resist 482) as an implant mask for the cell 400.

At 530 the implanted wafer is rotated by about 180° relative to the direction of the first implant, for example, by a platen within the end station of an ion implanter. At 540 one or more dopant species (e.g., n-type or p-type) is again implanted into the active region (e.g., 446 or 447) in a second angled implant (e.g., pocket implant rotation 2) using the resist structures (e.g., NLDD resist 442 or PLDD resist 482) as an implant mask for the cell 400. Alternately, prior to the second implant one or more intermediate rotations (e.g., two 90° rotations) and/or implantations may also be accomplished between the first and second implants and respective rotations.

Thereafter, the resist (e.g., NLDD resist 442 or PLDD resist 482) may be removed by an etch or CMP process, for example, and the steps above (e.g., steps 510 through 540) repeated at 550 for the other of the nMOS or pMOS active regions of the SRAM memory cell 400.

Although a first and second implant is discussed in association with the methods and figures of the present invention, it will be appreciated that one or more such implants, including one or more groups of implantations are anticipated in each of the first and second implantations including other vertical, angled or pocket implantations of any of a variety of dopant species.

FIGS. 6A, 6B, 6C, and 6D, for example, illustrate four exemplary adjacent SRAM cells 300 of an SRAM memory array 600, using conventional NLDD and PLDD resist patterning of the array. SRAM memory cells 300, are similar to those of FIGS. 3A-3D, and as such need not be completely described again for the sake of brevity. The SRAM memory array 600 also illustrates how the cells interconnect with one another to share in common Vdd contacts 412, Vss contacts 414, bit lines BL 430, bit line-bar lines BLB 432, which may comprise a contact material 448. The cells also share columns of nMOS active regions 446 and pMOS active regions 447 that are separated by isolation regions STI 451, and rows of polysilicon gates 444 connected to wordlines at contacts 438a and 438b.

Figure 6A:
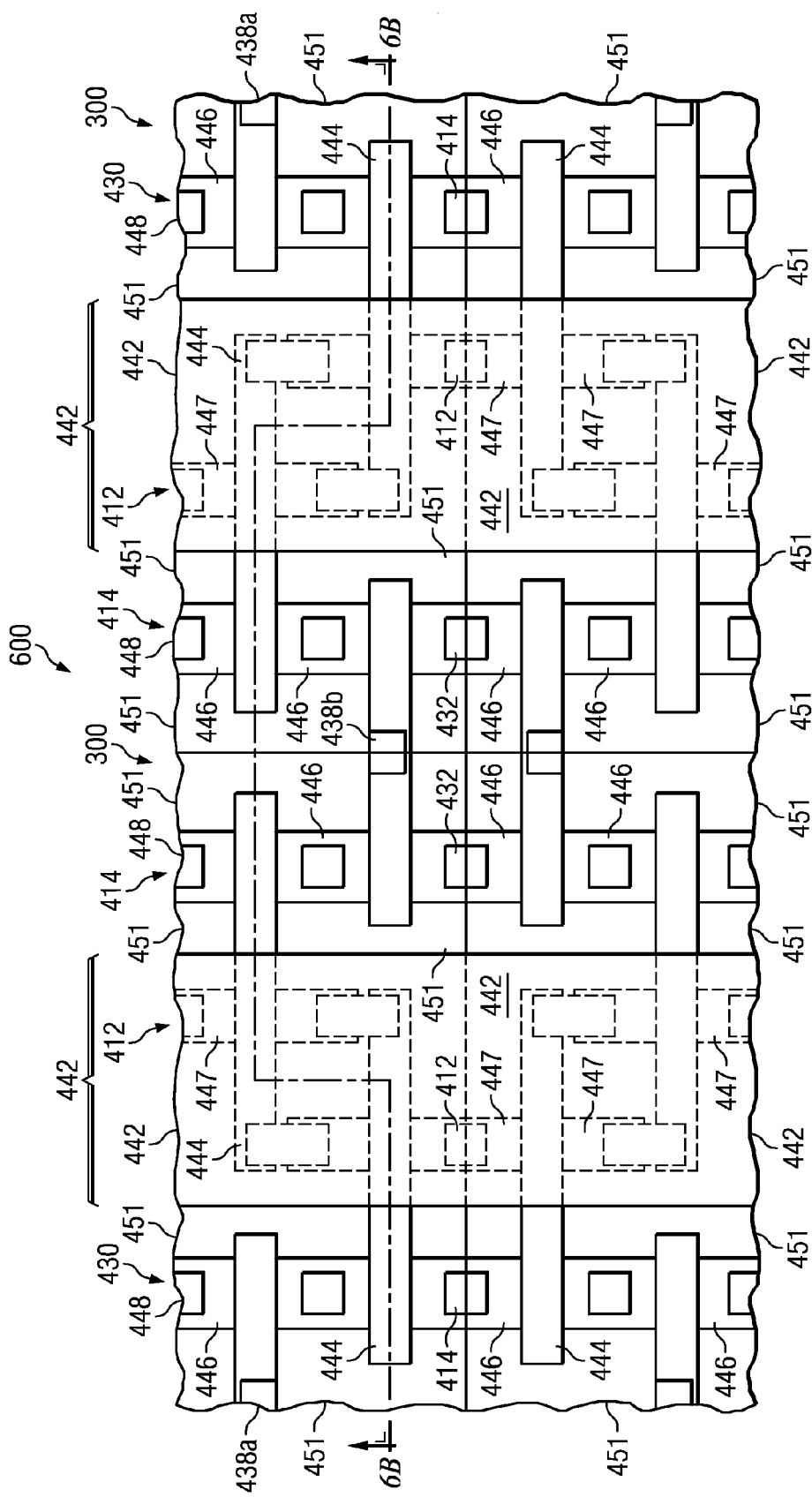
FIGS. 6A-6D are top plan and corresponding cross-sectional side views, respectively, illustrating four adjacent SRAM cells of an SRAM memory array using conventional NLDD and PLDD resist patterning of the array, and also illustrating resist potential misalignment issues relevant to the formation thereof during n-type and p-type dopant implanting.
Figure 6B:
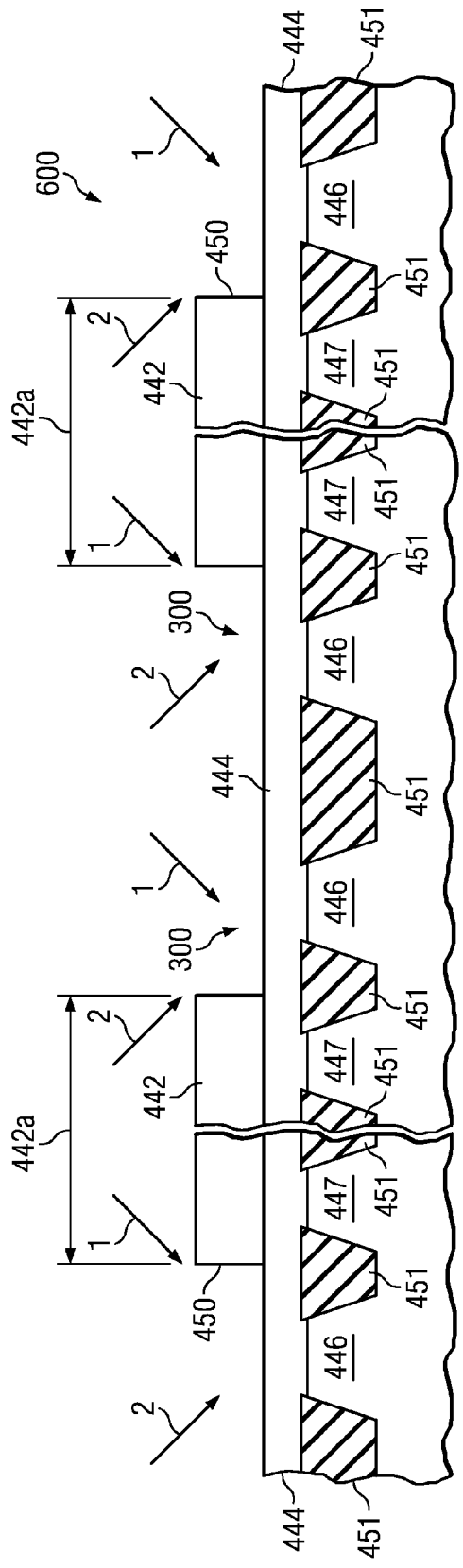

FIG. 6A also illustrates a cross-section (dash-dot line) A-A to represent the cross-section of FIG. 6B. FIGS. 6A and 6B illustrate the use of the NLDD resist 442 covering the pMOS active regions 447 during n-type implantation of the nMOS active regions 446 (described previously), while FIGS. 6C and 6D illustrate the use of a PLDD resist 482 covering the nMOS active regions 446 during p-type implantation of the pMOS active regions 447.

Figure 6D:
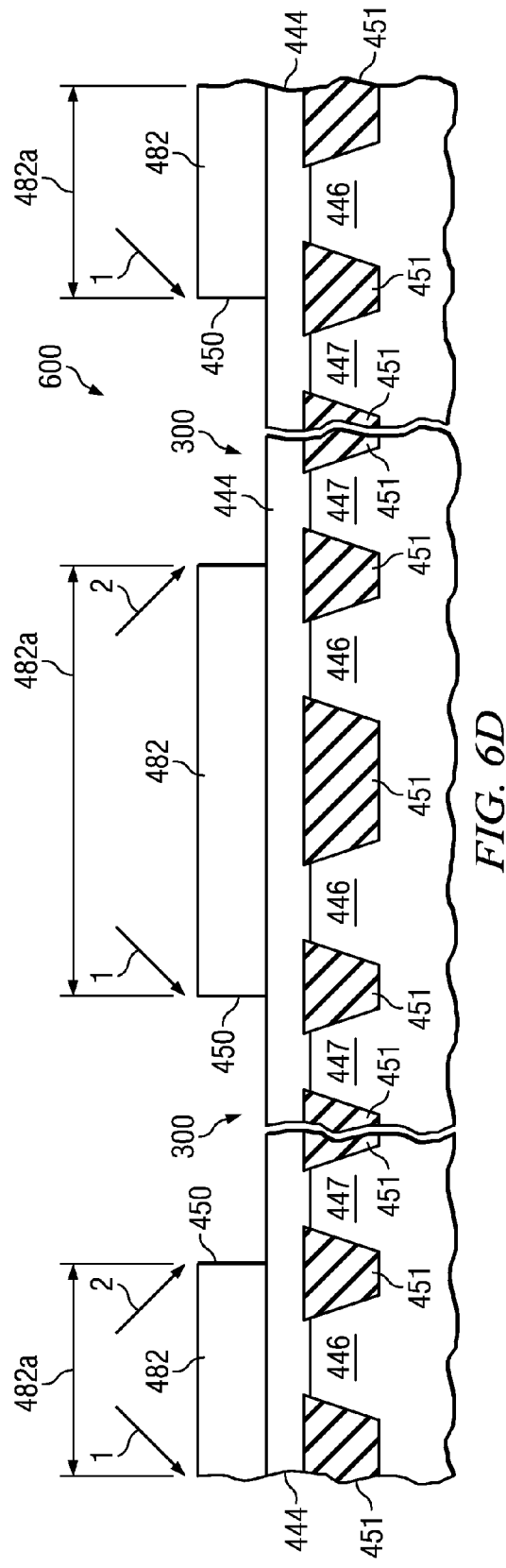
Figure 6C:
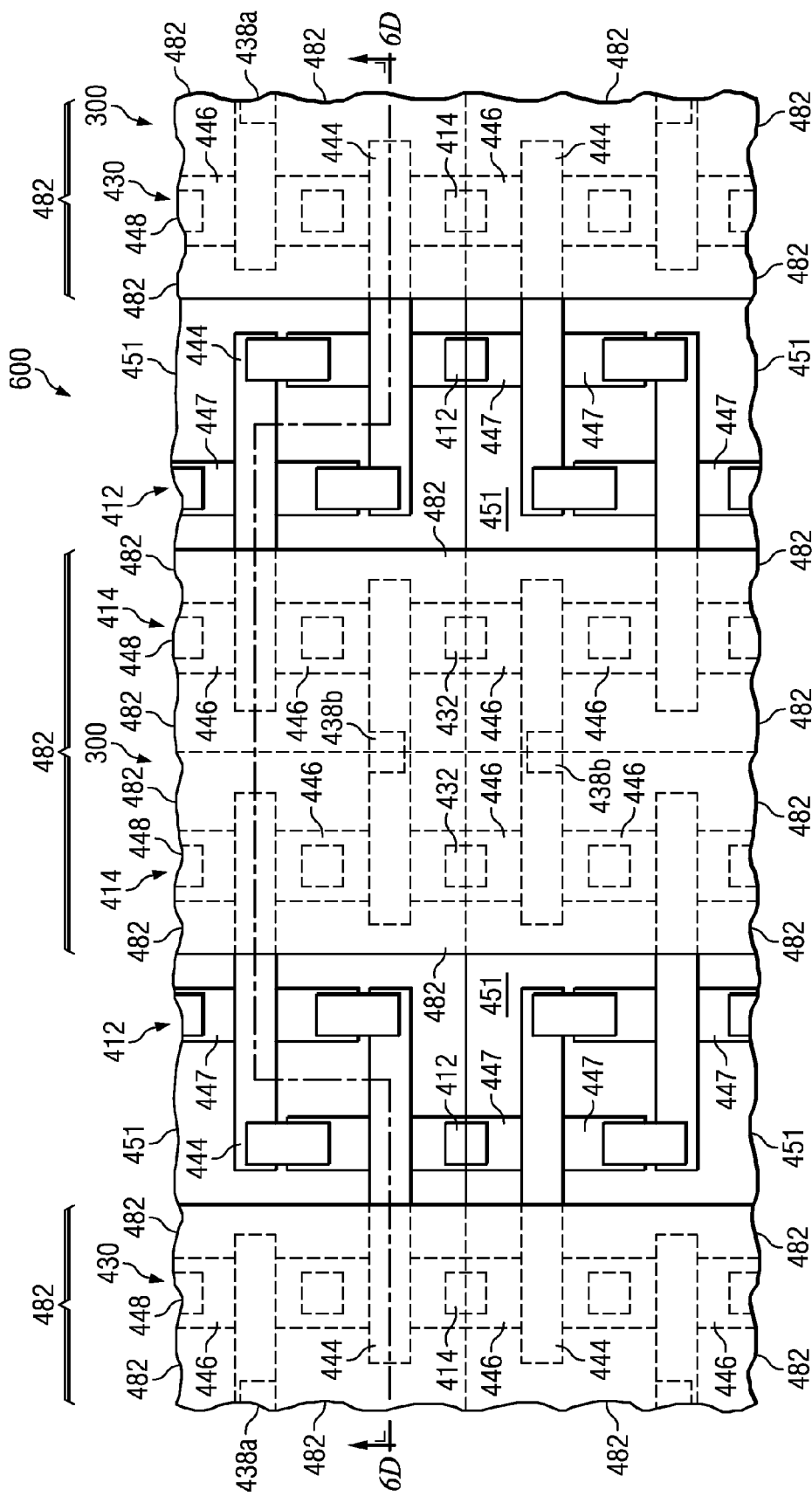

FIGS. 6B and 6D further illustrate the pocket implant rotations 1 and 2, as they may occur near the edges of the respective resist structures, which are only shown in the nominal patterning locations (e.g., 450 of FIG. 3D), but wherein the same potential resist misalignment issues are relevant to the formation thereof during n-type and p-type dopant implanting.

Figure 7A:
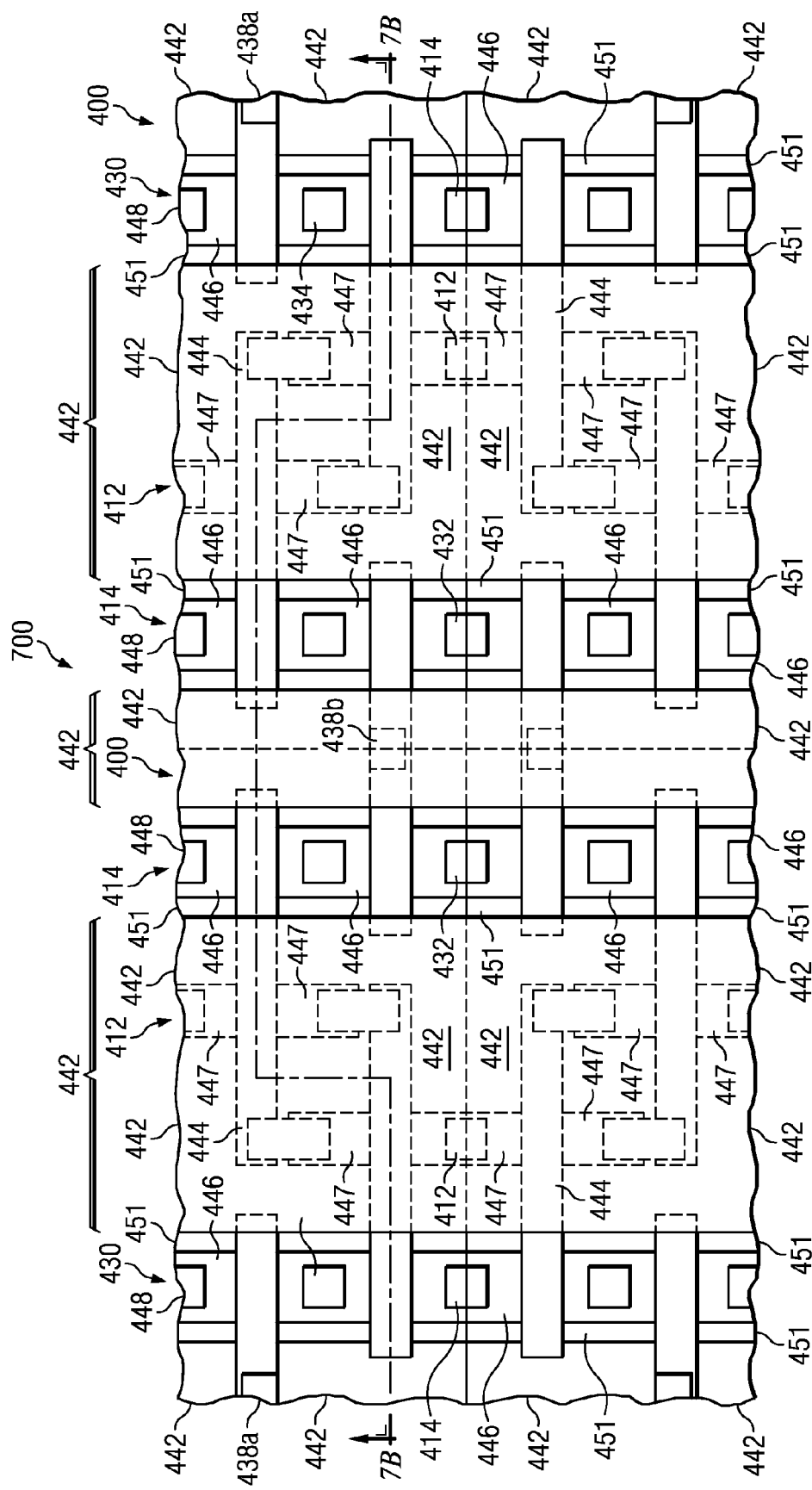
FIGS. 7A-7D are top plan and corresponding cross-sectional side views, respectively, illustrating four adjacent SRAM cells of an SRAM memory array using an exemplary modified NLDD and PLDD resist patterning for active regions of the array to provide double-sided shadowing in accordance with the present invention, and further illustrating resist potential misalignment issues relevant to the formation thereof during n-type and p-type dopant implanting.
Figure 7B:
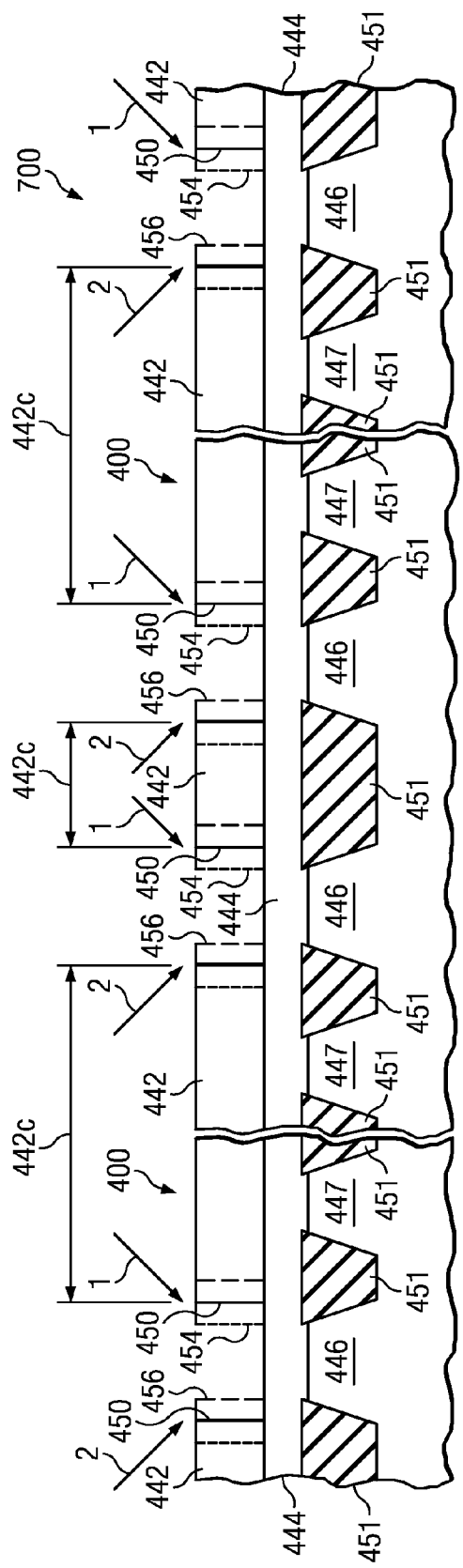

FIGS. 7A, 7B, 7C, and 7D, similarly illustrate four exemplary adjacent SRAM cells 400 of an SRAM memory array 700 using an exemplary modified NLDD and PLDD resist patterning for the active regions of the array 700 to provide uniform pocket implanting using double-sided shadowing in accordance with the method 500 of the present invention. FIGS. 7B an 7D or 7F further illustrate resist potential misalignment issues relevant to the formation thereof during n-type and p-type dopant implanting, in the context of the resist patterning method solution of the present invention.

The SRAM memory array 700 also illustrates how the cells interconnect with one another to share in common Vdd contacts 412, Vss contacts 414, bit lines BL 430, bit line-bar lines BLB 432, which may comprise a contact material 448. The cells 400 also share columns of nMOS active regions 446 and pMOS active regions 447 that are separated by isolation regions STI 451, and rows of polysilicon gates 444 connected to wordlines at contacts 438a and 438b.

FIG. 7A also illustrates a cross-section (dash-dot line) A-A to represent the cross-section of FIG. 7B. FIGS. 7A and 7B illustrate the use of the NLDD resist 442 covering the pMOS active regions 447 during n-type implantation of the nMOS active regions 446 (described previously), while FIGS. 7C and 7D, or 7E and 7F illustrate the use of a PLDD resist 482 covering the nMOS active regions 446 during p-type implantation of the pMOS active regions 447.

Figure 7D:
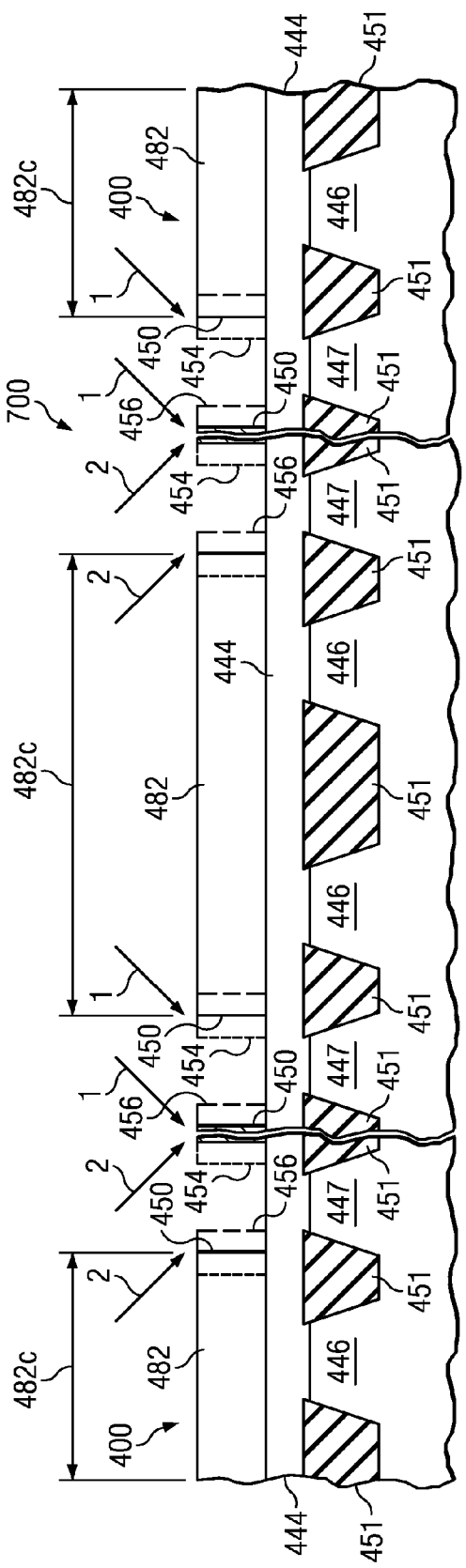

FIGS. 7B and 7D further illustrate the pocket implant rotations 1 and 2, as they may occur near the edges of the respective resist structures. FIGS. 7B and 7D, for example, also illustrate the resist nominal patterning locations 450, while the left resist misalignment locations 454 and right resist misalignment locations 456 demonstrate the solution according to the present invention during n-type and p-type dopant implanting. In particular, the NLDD resist 442 and the PLDD resist 482 structures of FIGS. 7B and 7D are increased to widths 442c and 482c, respectively, from widths 442a and 482a of FIGS. 6B and 6D. Further, resist is formed on both sides of the active regions 446, 447, and the openings in the resist are narrowed to within about one overlay error specification of the edges of the active regions 446, 447.

As previously indicated, the wider (e.g., widths 442c and 482c) double-sided resist structures (e.g., NLDD resist 442 or PLDD resist 482) of the present invention provide greater covering for the active regions which are not intended to be implanted, while generally limiting the implant regions to those pocket implant rotations which are aligned parallel to the active regions. These modifications to the resist pattern provide a uniform pocket implant which is substantially immune to the imbalances of pattern misalignment.

Figure 7C:
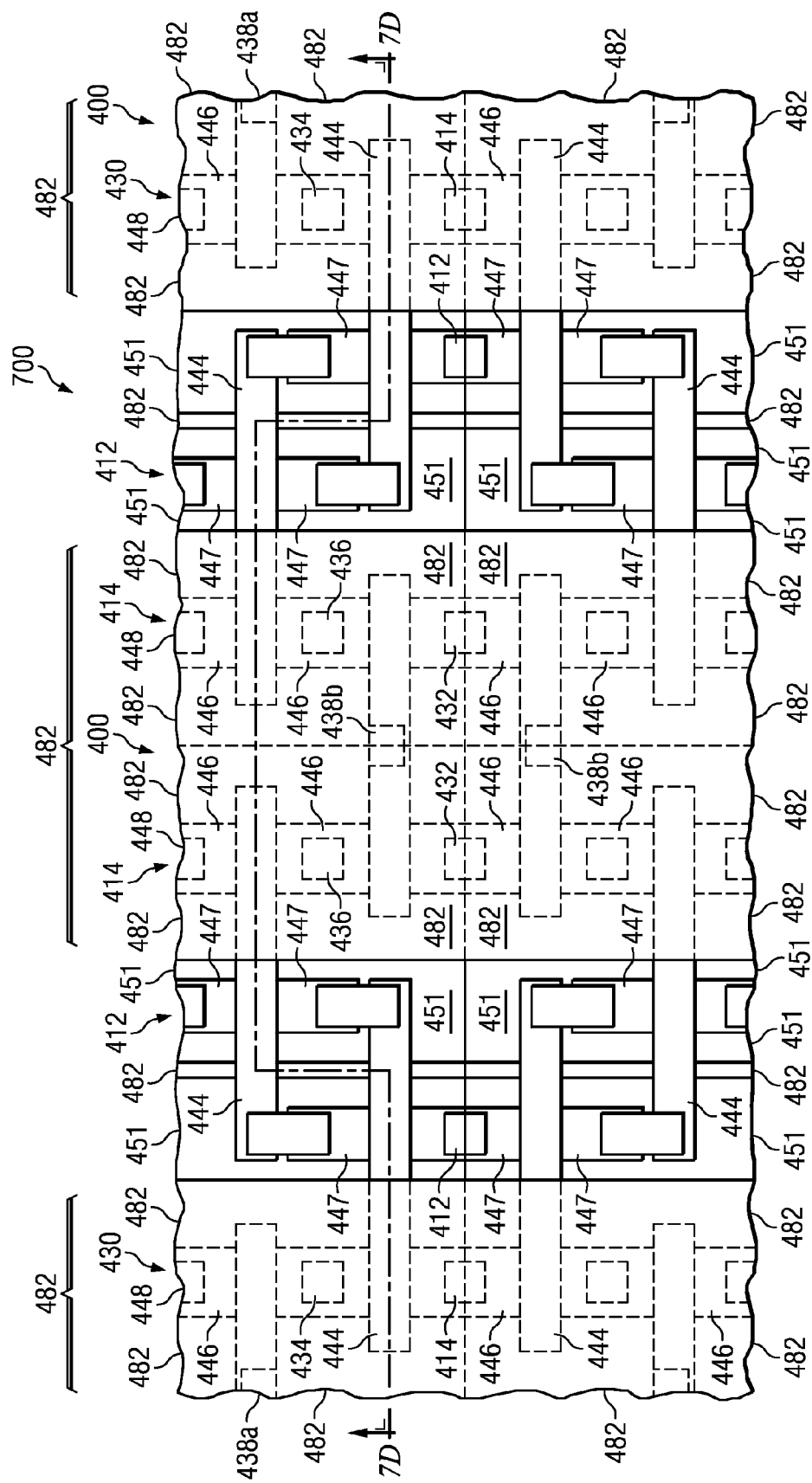
Figure 7E:
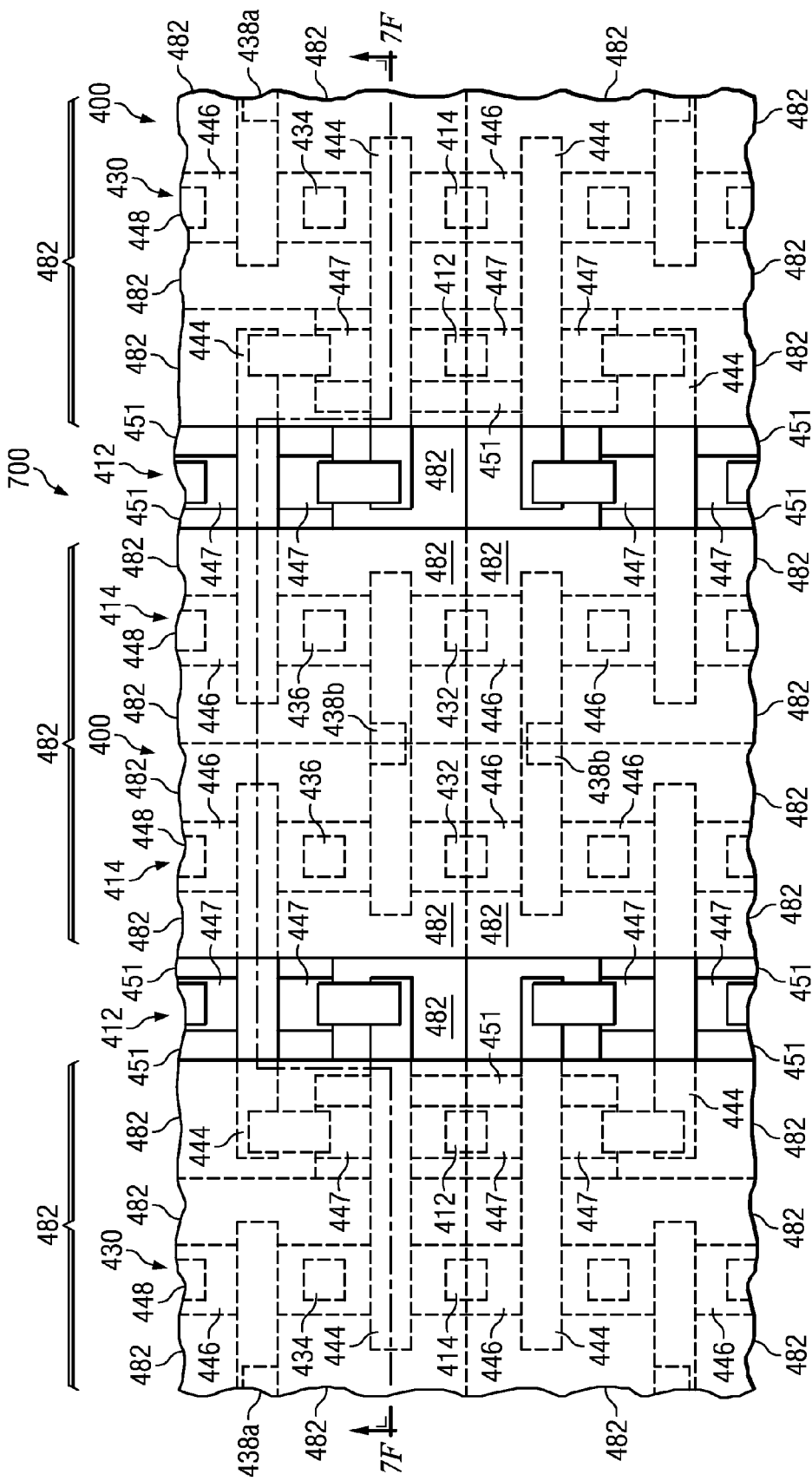
FIGS. 7E-7F are top plan and corresponding cross-sectional side views, illustrating four adjacent SRAM cells of an SRAM memory array using another exemplary modified PLDD resist patterning implementation to provide double-sided shadowing in accordance with the present invention, during n-type dopant implanting.
Figure 7F:
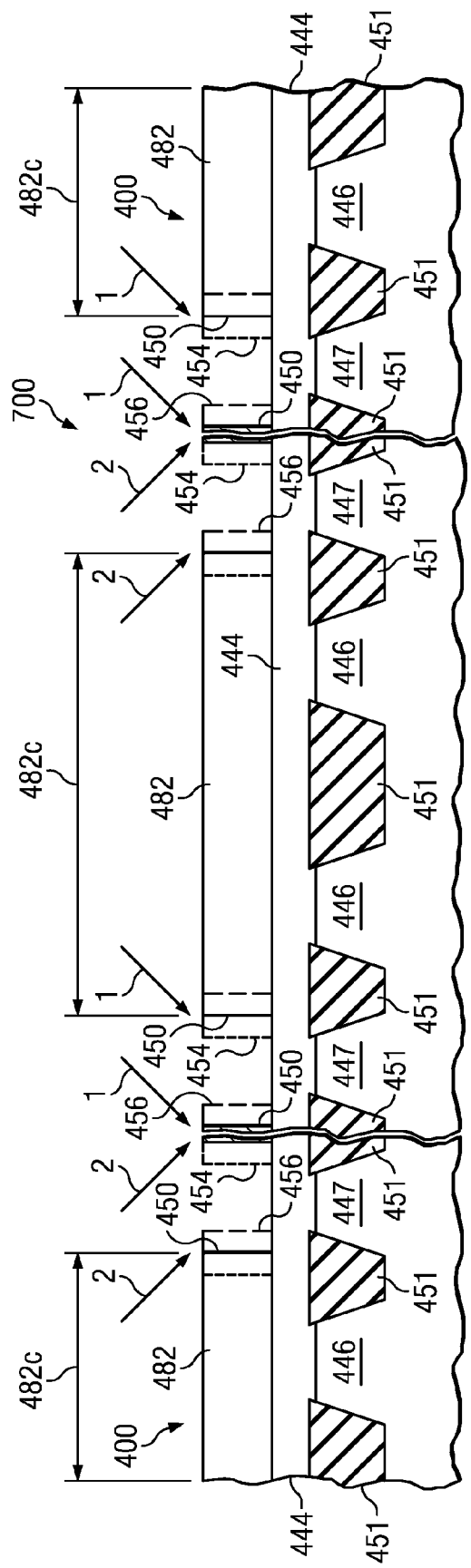

FIGS. 7E and 7F illustrates another exemplary modified resist patterning implementation for the four adjacent SRAM cells 400 of an SRAM memory array 700, in order to provide double-sided shadowing in accordance with the present invention, for example, during n-type dopant implanting.

The key difference between the patterning methods illustrated in FIGS. 7C and 7D, as compared to that of FIGS. 7E and 7F, is that a single narrow PLDD resist structure 482 is used between the pMOS transistor active regions 447 in FIGS. 7C and 7D, while a resist structure 482 that is wider in most areas is used between the pMOS transistor active regions 447 in FIGS. 7E and 7F.

In this manner, a resist layer provided by a lithography step may be formed and/or etched before and/or after an ion implantation to compensate the effects of cross-diffusion using increased pocket shadowing where densely packed and/or matched transistors are employed using narrowed resist openings during subsequent pocket implantation. Further, the thickness and CD of the resist may be optimally designed for the LDD implant to get a different (narrower) CD that is optimal for the pocket implant. That is, in the LDD implant, a resist edge should be closer to the uncovered transistor. This avoids cross diffusion of dopants implanted into the polysilicon and into the polysilicon gate of the covered transistor.

It will thus be appreciated that an SRAM incorporating such transistors may be more stable as the transistors are more likely to be balanced or matched when fabricated in accordance with the methods of the present invention.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant to mean an example, rather than the best. It is also to be appreciated that layers and/or elements depicted herein are illustrated with particular dimensions relative to one another (e.g., layer to layer dimensions and/or orientations) for purposes of simplicity and ease of understanding, and that actual dimensions of the elements may differ substantially from that illustrated herein. Additionally, the layers can be formed in any number of suitable ways, such as with spin-on techniques, sputtering techniques (e.g., magnetron or ion beam sputtering), (thermal) growth techniques and/or deposition techniques such as chemical vapor deposition (CVD), for example.

What is claimed is:

1. A method of fabricating an SRAM memory cell, comprising:
    providing a silicon substrate having a first pair of adjacent active regions of given n or p conductivity type well disposed between second and third pairs of adjacent active regions of opposite n or p conductivity type well, the active regions being isolated from one another by isolation regions formed in the substrate;
    forming common gates over at least the active regions of the first pair, and over ones of the active regions of the first pair and respective ones of the active regions of the second and third pairs;
    patterning a resist layer overlying the active regions of the first pair and over a portion of the isolation regions isolating at least one of each of the active regions of the second and third pairs, such that resist structures are formed on opposite sides of the at least one of each of the active regions of the second and third pairs to equally shadow laterally opposed first and second pocket implants made at same by oppositely directed angles, wherein the patterned resist structures overlying the isolation regions are about equally spaced away from and on opposite sides of the at least one of each of the active regions of the second and third pairs;
    implanting one or more dopant species of the opposite n or p conductivity type at an angle into the at least one of each of the active regions in a first pocket implant using the patterned resist layer including the resist structures as an implant mask;
    adjusting the rotational orientation between the substrate and the first pocket implant by about 180 degrees; and
    implanting the one or more dopant species at about the same but oppositely directed angle into the at least one of each of the active regions in a second pocket implant using the patterned resist layer including the resist structures as an implant mask.

2. The method of claim 1, further comprising removing the resist layer after the second pocket implant step.

3. The method of claim 1, further comprising:
    patterning a second resist layer overlying the active regions of the second and third pairs and over a portion of the isolation regions isolating at least one of the active regions of the first pair, such that second resist structures are formed on opposite sides of the at least one of the active regions of the first pair to equally shadow laterally opposed third and fourth pocket implants made at same by oppositely directed angles, wherein the patterned second resist structures overlying the first pair isolation regions are about equally spaced away from and on opposite sides of the at least one of the active regions of the first pair;
    implanting one or more second dopant species of the given n or p conductivity type at a second angle into the at least one of the active regions of the first pair in a third pocket implant using the second patterned resist layer including the second resist structures as an implant mask;
    adjusting the rotational orientation between the substrate and the third pocket implant by about 180 degrees; and
    implanting the one or more second dopant species at about the same but oppositely directed second angle into the at least one of the active regions of the first pair in a fourth pocket implant using the second patterned resist layer including the second resist structures as an implant mask.

4. The method of claim 1, wherein the resist structures formed on opposite sides of the at least one of each of the active regions of the second and third pairs are spaced away from the respective active region by about one overlay error specification.

* * * * *